(12) United States Patent
Yamazaki

(10) Patent No.: US 9,991,394 B2
(45) Date of Patent: Jun. 5, 2018

(54) SEMICONDUCTOR DEVICE AND FABRICATION METHOD THEREOF

(71) Applicant: Semiconductor Energy Laboratory Co., Ltd., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days. days.

(21) Appl. No.: 15/045,670

(22) Filed: Feb. 17, 2016

(65) Prior Publication Data

US 2016/0247928 A1    Aug. 25, 2016

(30) Foreign Application Priority Data

Feb. 20, 2015 (JP) ................ 2015-032320

(51) Int. Cl.
*H01L 29/10* (2006.01)
*H01L 29/786* (2006.01)
(Continued)

(52) U.S. Cl.
CPC ...... *H01L 29/7869* (2013.01); *H01L 27/1225* (2013.01); *H01L 29/045* (2013.01);
(Continued)

(58) Field of Classification Search
CPC .. F27B 9/201; H01L 29/045; H01L 29/41733; H01L 29/41775; H01L 29/7869; H01L 29/78696
(Continued)

(56) References Cited

U.S. PATENT DOCUMENTS 5,528,032 A    6/1996   Uchiyama
5,731,856 A    3/1998   Kim et al.
(Continued)

FOREIGN PATENT DOCUMENTS

EP    1737044 A    12/2006
EP    2226847 A    9/2010
(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.
(Continued)

*Primary Examiner* — Mohammed Shamsuzzaman
(74) *Attorney, Agent, or Firm* — Fish & Richardson P.C.

(57) ABSTRACT

A transistor with high and stable electrical characteristics whose parasitic capacitance is suppressed is provided even when miniaturized. A semiconductor device including it also achieves higher performance and reliability. The transistor includes an oxide semiconductor over a substrate, first and second electrodes in contact with the oxide semiconductor, an insulator over the oxide semiconductor, and the first and second electrodes, and a third electrode over the insulator. The oxide semiconductor includes a first region, a second region, and a third region overlapping with the first electrode, the second electrode, and the third electrode, respectively. The first region and the second region include a fourth region and a fifth region each overlapping with the third region, respectively. Top surfaces of the first and second electrodes are provided on the same plane as a top surface of the oxide semiconductor or the side closer to the oxide semiconductor than the same plane.

10 Claims, 18 Drawing Sheets

(51) Int. Cl.
*H01L 29/417* (2006.01)
*H01L 29/04* (2006.01)
*H01L 27/12* (2006.01)

(52) U.S. Cl.
CPC .. *H01L 29/41733* (2013.01); *H01L 29/41775* (2013.01); *H01L 29/78648* (2013.01); *H01L 29/78696* (2013.01)

(58) Field of Classification Search
USPC ...................................... 257/43, 64, 57, 347
See application file for complete search history.

(56) References Cited

U.S. PATENT DOCUMENTS

| | | | |
|---|---|---|---|
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2* | 8/2008 | Endo ................... | H01L 21/265 257/288 |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,203,143 B2* | 6/2012 | Imai .................... | H01L 29/7869 257/43 |
| 8,421,068 B2 | 4/2013 | Yamazaki et al. | |
| 8,421,069 B2 | 4/2013 | Yamazaki et al. | |
| 8,547,771 B2 | 10/2013 | Koyama | |
| 8,962,457 B2 | 2/2015 | Watanabe | |
| 9,412,877 B2 | 8/2016 | Tanaka et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1* | 1/2005 | Hoffman ............... | H01L 29/105 257/347 |
| 2005/0199959 A1 | 9/2005 | Chiang et al. | |
| 2006/0035452 A1 | 2/2006 | Carcia et al. | |
| 2006/0043377 A1* | 3/2006 | Hoffman ............. | H01L 29/7869 257/72 |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1* | 3/2007 | Kaji ................... | H01L 21/02554 438/795 |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0278490 A1* | 12/2007 | Hirao .................. | H01L 29/7869 257/64 |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1* | 10/2008 | Hoffman ............. | H01L 29/7869 438/104 |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0038641 A1* | 2/2010 | Imai .................... | H01L 29/78696 257/57 |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0017990 A1* | 1/2011 | Son ..................... | H01L 29/7869 257/43 |
| 2012/0025191 A1 | 2/2012 | Yamazaki | |
| 2014/0225105 A1* | 8/2014 | Tanaka ................ | H01L 29/7869 257/43 |
| 2015/0270402 A1 | 9/2015 | Endo et al. | |
| 2015/0280013 A1 | 10/2015 | Yamazaki et al. | |
| 2015/0372009 A1 | 12/2015 | Yamazaki | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |

(56) References Cited

FOREIGN PATENT DOCUMENTS

| | | |
|---|---|---|
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2012-059860 | 3/2012 |
| JP | 2012-059860 A | 3/2012 |
| JP | 2012-257187 | 12/2012 |
| JP | 5215589 | 3/2013 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of the International Electron Devices Meeting, Dec. 5, 2005, pp. 1067-1069.

Ikeda.T et al., "Full-Functional System Liquid Crystal Display Using Cg-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=in,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs,", IDW '09 : Proceedings of the 16th International Display Workshops, 2009, pp. 689-692.

Park.J et al., "Amorphous Indium-Gallium Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.

Osada.T et al., "Development of Driver-Integrated Panel Using Amorphous In—Ga—Zn-Oxide TFT,", AM-FPD '09 Digest of Technical Papers, Jul. 1, 2009, pp. 33-36.

(56) References Cited

OTHER PUBLICATIONS

Hirao.T et al., "Novel Top-Gate Zinc Oxide Thin-Film Transistors (ZnO TFTs) for AMLCDS,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of the Technical Papers, 2007, vol. 38, pp. 1830-1833.
Godo.H et al., "P-9:Numerical Analysis on Temperature Dependence of Characteristics of Amorphous In—Ga—Zn-Oxide TFT,", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTs With a Novel Passivation Layer,", SID Digest '09 : SID International Symposium Digest of Technical Papers, May 31, 2009, pp. 284-287.
Miyasaka.M, "Suftla Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED ,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Nakamura.M, "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 2, 2002, vol. 1, pp. 64-68.
Kimizuka.N et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures over 1000° C.,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emmission AM-OLED Display,", SID Digest '08 : SID International Symposium Digest of Technical Papers, May 20, 2008, vol. 39, pp. 629-632.
Orita.M et al., "Mechanism of Electrical Conductivity of Transparent InGaZnO4,", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.
Janotti.A et al., "Native Point Defects in ZnO,", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-72104-3.
Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.
Janotti.A et al., "Oxygen Vacancies in ZnO,", Appl. Phys. Lett. (Applied Physics Letters) , 2005, vol. 87, pp. 122102-1-122102-3.
Oba.F et al., "Defect energetics in ZnO: A hybrid Hartree-Fock density functional study,", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays,", IDW'08 : Proceedings of the 6th International Display Workshops, Dec. 3, 2008, pp. 581-584.
Kim.S et al., "High-Performance oxide thin film transistors passivated by various gas plasmas,", 214th ECS Meeting, 2008, No. 2317, ECS.
Clark.S et al., "First Principles Methods Using CASTEP,", Zeitschrift fur Kristallographie, 2005, vol. 220, pp. 567-570.
Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.
Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

* cited by examiner

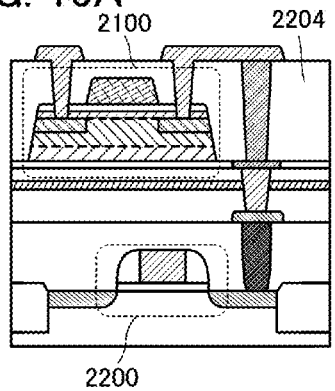
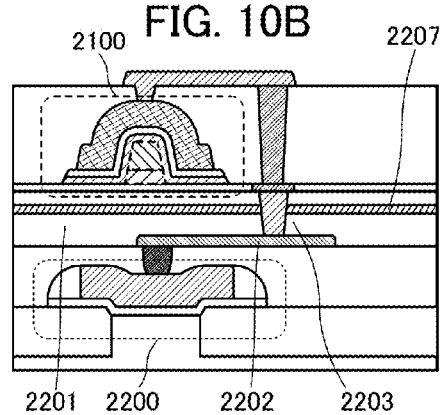
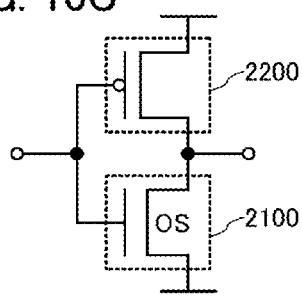
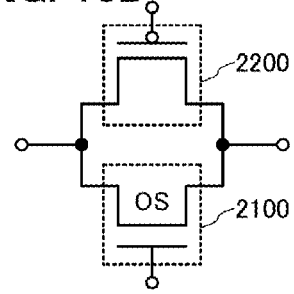
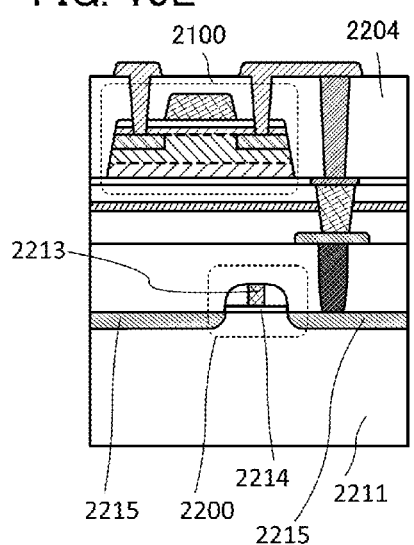
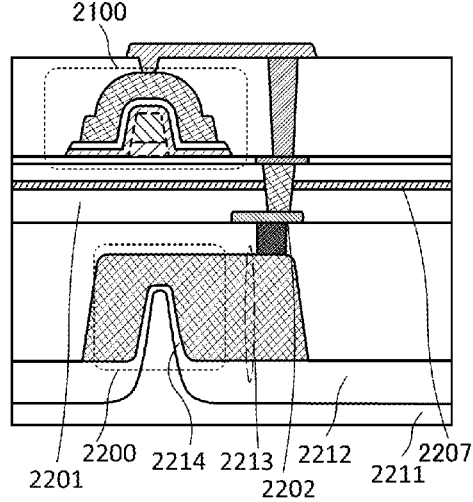

SEMICONDUCTOR DEVICE AND FABRICATION METHOD THEREOF

BACKGROUND OF THE INVENTION

1. Field of the Invention

The present invention relates to, an oxide, a transistor, a semiconductor device, and fabricating methods thereof, for example. The present invention relates to an oxide, a display device, a light-emitting device, a lighting device, a power storage device, a memory device, a processor, an imaging device, or an electronic device, for example. The present invention relates to a fabricating method of an oxide, a display device, a liquid crystal display device, a light-emitting device, a memory device, a processor, an imaging device, or an electronic device. The present invention relates to a driving method of a semiconductor device, a display device, a liquid crystal display device, a light-emitting device, a memory device, a processor, an imaging device, and an electronic device.

Note that one embodiment of the present invention is not limited to the above technical field. The technical field of one embodiment of the invention disclosed in this specification and the like relates to an object, a method, or a fabricating method. In addition, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

2. Description of the Related Art

A technique for forming a transistor by using a semiconductor over a substrate having an insulating surface has attracted attention. The transistor is applied to a wide range of semiconductor devices such as an integrated circuit and a display device. Silicon is known as a semiconductor applicable to a transistor.

As silicon which is used as a semiconductor of a transistor, either amorphous silicon or polycrystalline silicon is used depending on the purpose. For example, in the case of a transistor included in a large display device, it is preferable to use amorphous silicon, which can be used to form a film on a large substrate with the established technique. On the other hand, in the case of a transistor included in a high-performance display device where driver circuits are formed over the same substrate, it is preferred to use polycrystalline silicon, which can form a transistor having high field-effect mobility. As a method for forming polycrystalline silicon, high-temperature heat treatment or laser light treatment which is performed on amorphous silicon has been known.

In recent years, transistors using oxide semiconductors (typically, In—Ga—Zn oxide) have been actively developed.

Oxide semiconductors have been researched since early times. In 1988, there was a disclosure of a crystal In—Ga—Zn oxide that can be used for a semiconductor element (see Patent Document 1). In 1995, a transistor including an oxide semiconductor was invented, and its electrical characteristics were disclosed (see Patent Document 2).

In addition, a transistor including an amorphous oxide semiconductor is disclosed (see Patent Document 3). An oxide semiconductor can be formed by a sputtering method or the like, and thus can be used for a semiconductor of a transistor in a large display device. A transistor including an oxide semiconductor has high field-effect mobility; therefore, a high-performance display device where driver circuits are formed over the same substrate can be obtained. In addition, there is an advantage that capital investment can be reduced because part of production equipment for a transistor including amorphous silicon can be retrofitted and utilized.

It is known that a transistor including an oxide semiconductor has an extremely low leakage current in an off state. For example, a low-power-consumption CPU utilizing the small leakage current characteristic of a transistor including an oxide semiconductor is disclosed (see Patent Document 4). It is also disclosed that a transistor having a high field-effect mobility can be obtained by a well potential formed using an active layer including an oxide semiconductor (see Patent Document 5).

[Reference]

[Patent Document]

[Patent Document 1] Japanese Published Patent Application No. S63-239117

[Patent Document 2] Japanese Translation of PCT International Application No. H11-505377

[Patent Document 3] Japanese Patent No. 5215589

[Patent Document 4] Japanese Published Patent Application No. 2012-257187

[Patent Document 5] Japanese Published Patent Application No. 2012-59860

SUMMARY OF THE INVENTION

Oxide semiconductors are less likely to decrease in resistance by impurity implantation and the like as compared to silicon. Therefore, in a transistor in which oxide semiconductors are used as its active layer and in which a gate electrode does not overlap with a source electrode or a gate electrode does not overlap with a drain electrode (the transistor is referred to as a "$L_{off}$ transistor" or the like in this specification), the on-state current of the transistor is decreased in some cases. Then, a transistor in which a gate electrode partly overlaps with a source electrode and the gate electrode partly overlaps with a drain (referred to as a "$L_{ov}$ transistor" or the like in this specification) is often fabricated.

However, the $L_{ov}$ transistor has a large parasitic capacitance between the gate electrode and the source electrode and between the gate electrode and the drain electrode. When, for example, there is a large parasitic capacitance in the vicinity of a channel (e.g., at a region sandwiched between the source electrode and the drain electrode), the transistor operation needs a time for charging the parasitic capacitance, resulting in decreasing not only the responsiveness of the transistor but the responsiveness of the semiconductor device. Furthermore, extra power consumption for charging the parasitic capacitance increases power consumption of a circuit including a plurality of transistors. Specifically as the transistor is miniaturized, the parasitic capacitance in the vicinity of the transistor is a non-negligible and significant problem.

Thus, an object of one embodiment of the present invention is to reduce the parasitic capacitance in the vicinity of a transistor. Another object is to provide a semiconductor device with low power consumption. An object of one embodiment of the disclosed invention is to provide a transistor that can be miniaturized and highly integrated and that has stable electrical characteristics. Alternatively, an object of one embodiment of the disclosed invention is to provide a transistor whose channel length is easily adjusted.

Another object of one embodiment of the present invention is to achieve high performance, high reliability, and high productivity of a semiconductor device including the transistor. Alternatively, an object of one embodiment of the disclosed invention is to provide a semiconductor device in which oxygen is easily supplied to a channel layer of the transistor. Another object is to provide a novel semiconductor device. Note that the descriptions of these objects do not disturb the existence of other objects. Note that one embodiment of the disclosed invention does not necessarily achieve all the objects listed above. Other objects will be apparent from and can be derived from the description of the specification, the drawings, the claims, and the like. Note that the descriptions of these objects do not disturb the existence of other objects. Note that one embodiment of the present invention does not necessarily achieve all the objects listed above.

A transistor provided in a semiconductor device includes an oxide semiconductor over a substrate, a first electrode and a second electrode that are in contact with the oxide semiconductor, an insulator over the oxide semiconductor, the first electrode, and the second electrode, and a third electrode over the insulator. The oxide semiconductor includes a first region overlapping with the first electrode, a second region overlapping with the second electrode, and a third region overlapping with the third electrode. The first region includes a fourth region overlapping with the third region. The second region includes a fifth region overlapping with the third region. Top surfaces of the first electrode and the second electrode are provided on the same plane as a top surface of the oxide semiconductor or on a side closer to the substrate than the same plane.

A transistor provided in a semiconductor device includes an oxide semiconductor, a first electrode, a second electrode, a third electrode, and an insulator. The third electrode is provided over the oxide semiconductor with the insulator interposed therebetween. The oxide semiconductor includes a first region overlapping with the first electrode, a second region overlapping with the second electrode, and a third region overlapping with the third electrode. The first region includes a fourth region overlapping with the third region. The second region includes a fifth region overlapping with the third region. Top surfaces of the first electrode and the second electrode are provided on the same plane as a surface of the oxide semiconductor close to the insulator or on a side closer to the oxide semiconductor than the same plane.

In any of the above structures, the length of each of the fourth region and the fifth region is longer than or equal to 0 nm and shorter than or equal to 5 nm.

In any of the above structures, the oxide semiconductor includes a region where a channel is to be formed and the insulator does not have a difference in level in a region overlapping with the region where a channel is to be formed.

In each of the above structures, the first electrode functions as one of a source electrode and a drain electrode, and the second electrode functions as the other of the source electrode and the drain electrode.

The electronic device includes any of the above semiconductor devices.

The transistor of the present invention can reduce parasitic capacitance and increase the on-state current. Thin film transistors capable of high-speed operation can be fabricated.

As described above, since the on-state current is high and the off-state current is low, the driving characteristic of the transistor is improved. A transistor with high and stable electrical characteristics can be provided even when the transistor is miniaturized.

Also in a semiconductor device including the transistor, high performance, high reliability, and high productivity can be achieved. Alternatively, a novel semiconductor device can be provided. Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

In the accompanying drawings:

FIGS. 10A, 10B, 10E, and 10F are cross-sectional views and FIGS. 10C and 10D are circuit diagrams illustrating embodiments of semiconductor devices;

DETAILED DESCRIPTION OF THE INVENTION

Figure 1A:
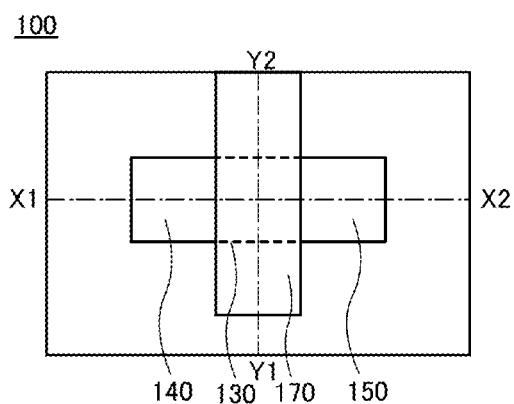
FIG. 1A is a top view and FIGS. 1B and 1C are cross-sectional views illustrating one embodiment of a semiconductor device.

Embodiments will be described below with reference to the drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings. In the drawings, the same portions or portions having similar functions are denoted by the same reference numerals in different drawings, and explanation thereof will not be repeated. The same hatching pattern is applied to portions having similar functions, and the portions are not especially denoted by reference numerals in some cases.

Ordinal numbers such as "first" and "second" in this specification and the like are used for convenience and do not denote the order of steps or the stacking order of layers. Therefore, for example, description can be made even when "first" is replaced with "second" or "third," as appropriate. In addition, the ordinal numbers in this specification and the like are not necessarily the same as the ordinal numbers used to specify one embodiment of the present invention.

In this specification and the like, terms for explaining arrangement, such as "over" and "under," are used for convenience to describe the positional relation between components with reference to drawings. The positional relation between components is changed as appropriate in accordance with a direction in which each component is described. Thus, the positional relation is not limited to that described with a term used in this specification and can be explained with the other terms as appropriate depending on the situation.

The "semiconductor device" in this specification and the like means all devices which can operate by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

In this specification and the like, a transistor is an element having at least three terminals: a gate, a drain, and a source. The transistor has a channel region between the drain (a drain terminal, a drain region, or a drain electrode) and the source (a source terminal, a source region, or a source electrode), and current can flow through the drain, the channel region, and the source. Note that in this specification and the like, a channel region refers to a region through which current mainly flows.

Functions of a source and a drain are sometimes replaced with each other when a transistor of opposite polarity is used or when the direction of current flowing is changed in circuit operation, for example. Therefore, the terms "source" and "drain" can be replaced with each other in this specification and the like.

Note that in this specification and the like, a silicon oxynitride film refers to a film in which the proportion of oxygen is higher than that of nitrogen. The silicon oxynitride film preferably contains oxygen, nitrogen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively. A silicon nitride oxide film refers to a film in which the proportion of nitrogen is higher than that of oxygen. The silicon nitride oxide film preferably contains nitrogen, oxygen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively.

In this specification and the like, the terms "film" and "layer" can be interchanged with each other. For example, the term "conductive layer" can be changed into the term "conductive film" in some cases. In addition, the term "insulating film" can be changed into the term "insulating layer" in some cases.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in the drawings or texts, the other connection relationships are included in the drawings or texts.

Here, each of X and Y denotes an object (e.g., a device, an element, a circuit, a wiring, an electrode, a terminal, a conductive film, or a layer).

Examples of the case where X and Y are directly connected include the case where an element that enables electrical connection between X and Y (e.g., a switch, a transistor, a capacitor, an inductor, a resistor, a diode, a display element, or a light-emitting element) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, or a light-emitting element) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a storage circuit; or a control circuit) can be connected between X and Y. Note that for example, in the case where a signal output from X is transmitted to Y even when another circuit is provided between X and Y, X and Y are functionally connected. The case where X and Y are functionally connected includes the case where X and Y are directly connected and X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the explicit description "X and Y are connected."

For example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to part of Z1 and another part of Z1 is directly connected to X while a drain (or a second terminal or the like) of the transistor is directly connected to part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in that order;" "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in that order;" and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor through the transistor, Z1 is on the first connection path, the drain (or the second terminal or the like) of the transistor is electrically connected to Y through at least a third connection path, the third connection path does not include the second connection path, and Z2 is on the third connection path." Other examples of the expressions also include "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path," and "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film functions as the wiring and the electrode. Thus, the term "electrical connection" in this specification also means such a case where one conductive film has functions of a plurality of components.

(Embodiment 1)

In this embodiment, one embodiment of a semiconductor device will be described with reference to FIGS. 1A to 1C, FIGS. 2A to 2D, and FIGS. 3A to 3E.

<Structure Example 1 of Semiconductor Device>

Figure 1B:
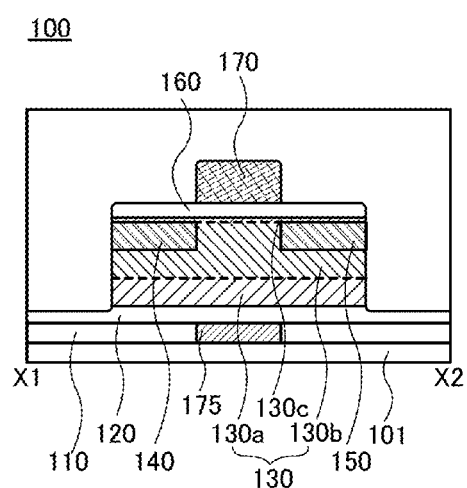

FIG. 1A illustrates an example of a top view of a transistor 100. For simplicity, some films are not illustrated in FIG. 1A. FIG. 1B is a cross-sectional view taken along the dashed-dotted line X1-X2 in FIG. 1A, and FIG. 1C is a cross-sectional view taken along the dashed-dotted line Y1-Y2 in FIG. 1A.

The transistor 100 provided over a substrate 101 includes an insulator 110, electrodes 175 and 170 functioning as gate electrodes, an oxide 130 including a region where a channel is to be formed, an electrode 140 functioning as one of a source and a drain, an electrode 150 functioning as the other of the source and the drain, and an insulator 160 functioning as a gate insulating layer.

The oxide 130 includes an insulator 130a, a semiconductor 130b over the insulator 130a, and an insulator 130c over the semiconductor 130b. When the transistor is turned on, current mainly flows through the semiconductor 130b; a channel is formed. Although current sometimes flow through a region in the vicinity of the interface (a mixed region in some cases) between the semiconductor 130b and the insulators 130a and 130c, the insulators 130a and 130c function as insulators at the other region. Therefore, the insulator 130a and the insulator 130c are defined as insulators in this specification because they have an insulating property relatively to the semiconductor 130b. The insulator 130a and the insulator 130c might have a semiconductor property relatively to other insulators in some cases.

Figure 1C:
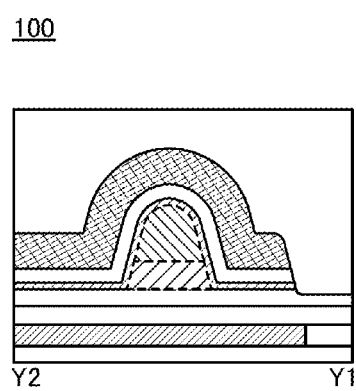

In the structure of the transistor 100 in FIGS. 1A to 1C, the electrode 140 and the electrode 150 are embedded in the semiconductor 130b; the semiconductor 130b between the electrode 140 and the electrode 150 becomes a region where a channel is to be formed.

Note that surfaces of the electrode 140 and the electrode 150 which are in contact with the insulator 130c are preferably on the same plane as a surface of the semiconductor 130b which is in contact with the insulator 130c or below the surface. That is, the electrodes 140 and 150 are formed so that the height of the top surface of the electrode 140 from the top surface of the substrate 101 and the height of the top surface of the electrode 150 from the top surface of the substrate 101 are lower than or equal to the height of the top surface of a region of the oxide 130 where a channel is to be formed from the top surface of the substrate 101. This structure does not have a difference in level between the region where a channel is to be formed and the electrode 170; thus, the insulator 130c and the insulator 160 over the region where a channel is to be formed can be provided without crossing over a difference in level.

The electrode 170 preferably includes regions overlapping with the electrode 140 and the electrode 150 in a region where the electrode 170 overlaps with the oxide 130. Note that the length of the portion where the electrode 170 overlaps with the electrode 140 or the electrode 150 is longer than or equal to 0 nm and shorter than or equal to 5 nm. When the overlapping length is 0 nm, the edge of the electrode 170 corresponds to the edge of the electrode 140 or the edge of the electrode 150 in the top view. The electrodes 140 and 150 do not overlap with the electrode 170 unnecessarily, whereby the parasitic capacitance can be reduced.

The electrode 140 and the electrode 150 can be formed using a metal film containing an element selected from molybdenum, titanium, tantalum, tungsten, aluminum, copper, chromium, neodymium, and scandium; a metal nitride film containing any of the above elements as its component (e.g., a titanium nitride film, a molybdenum nitride film, or a tungsten nitride film); or the like. Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can also be used. Moreover, the electrodes can have a stacked structure of the above conductive material and the above metal material.

The region where a channel is to be formed can be uniformly applied with a voltage in the above structure; therefore, a transistor in which leakage current is suppressed can be provided. With the use of a metal for the electrodes 140 and 150, a transistor with high on-state characteristics can be driven. Therefore, a transistor with high and stable electrical characteristics can be provided even when the transistor is miniaturized.

The above structure can provide a transistor with small parasitic capacitance because the shortest distance between the top surface of the region in the semiconductor 130b where a channel is to be formed and the electrode 170 is equal to or shorter than the shortest distance between the electrode 170 and the electrode 140 or 150. This structure does not have a difference in level between the region where a channel is to be formed and the electrode 170; thus, the insulator 130c and the insulator 160 over the region where a channel is to be formed can be provided without crossing over a difference in level.

The insulating layer 120 is preferably an insulating layer containing oxygen, such as a silicon oxide film or a silicon oxynitride film. Note that as the insulating film 120, an insulating layer containing excessive oxygen (containing oxygen in excess of stoichiometric composition) is preferably used. When such an insulating layer containing excess oxygen is provided in contact with the oxide 130, oxygen vacancies in the oxide 130 are compensated.

An oxide that forms the oxide 130 has a wide energy gap of 3.0 eV or more. A transistor including an oxide film obtained by processing of the oxide in an appropriate condition and a sufficient reduction in carrier density of the oxide can have much smaller leakage current between a source and a drain in an off state (off-state current) than a conventional transistor including silicon.

An applicable oxide preferably contains at least indium (In) or zinc (Zn). In particular, In and Zn are preferably contained. In addition, as a stabilizer for reducing variation in electrical characteristics of a transistor using the oxide, one or more elements selected from gallium (Ga), tin (Sn), hafnium (Hf), zirconium (Zr), titanium (Ti), scandium (Sc), yttrium (Y), and a lanthanoid (such as cerium (Ce), neodymium (Nd), or gadolinium (Gd)) is preferably contained.

Here, the case where the oxide 130 contains indium, an element M, and zinc is considered. The element M is preferably aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, tungsten, and the like. Note that two or more of the above elements may be used in combination as the element M. A favorable range of the atomic ratio of indium to the element M and zinc (x:y:z) of the oxide 130 is described with reference to FIGS. 4A and 4B.

Figure 4A:
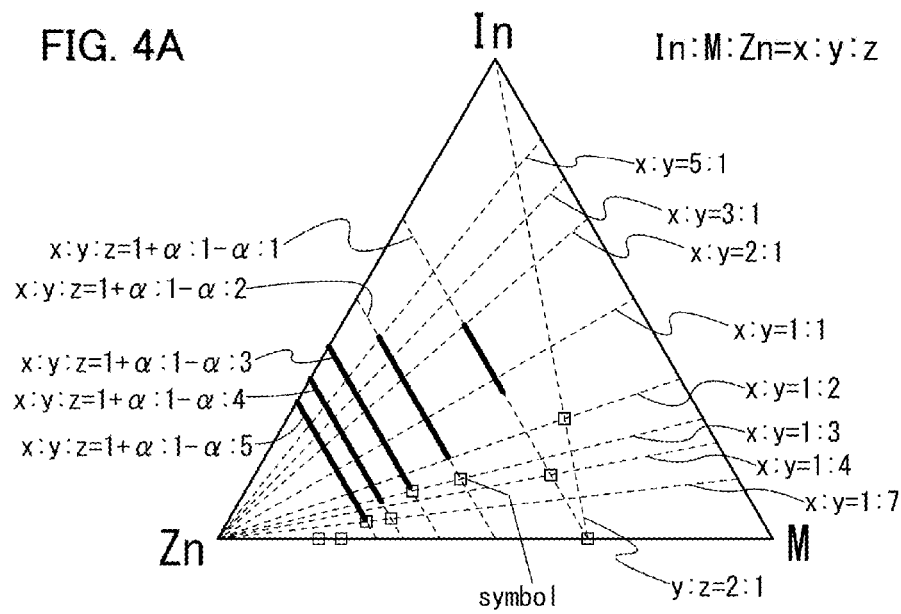
FIGS. 4A and 4B each illustrate an atomic ratio of an oxide of one embodiment of the present invention.
Figure 4B:
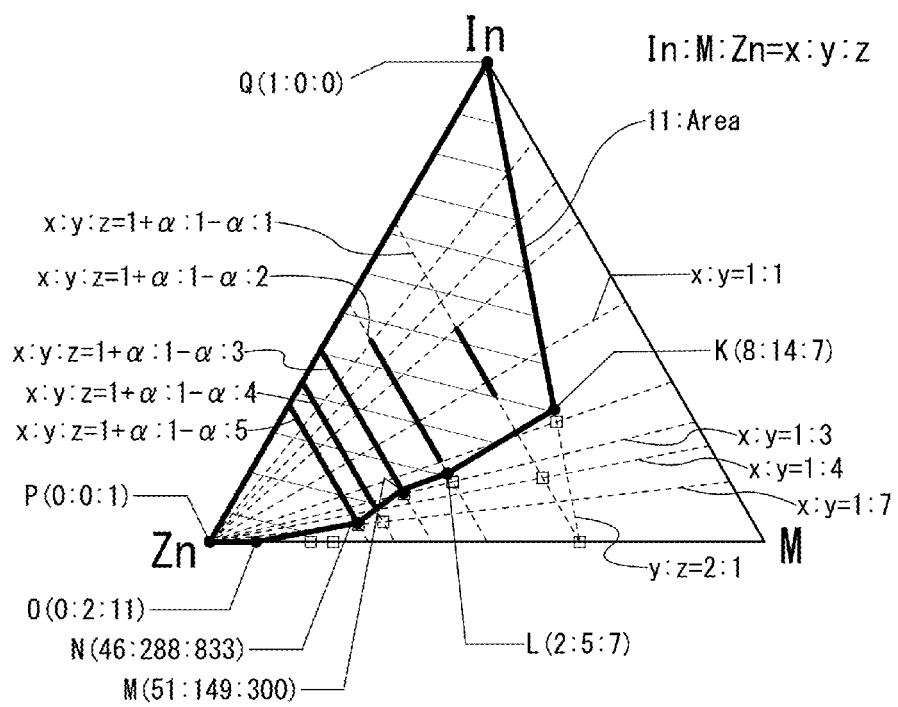

FIGS. 4A and 4B show the range of the atomic ratio of indium to the element

M and zinc of the oxide 130. Here, FIGS. 4A and 4B show an example in which the element M is Ga. Note that the proportion of oxygen atoms is not shown in FIGS. 4A and 4B.

For example, it is known that there is a homologous series represented by $InMO_3(ZnO)_m$ (m is a natural number) as one of oxides containing indium, the element M, and zinc. Here, the case where the element M is Ga is considered, for example. It is known that regions denoted by thick lines in FIGS. 4A and 4B indicate compositions which allow a single-phase solid solution range when powders of $In_2O_3$, $Ga_2O_3$, and ZnO are mixed and sintered at 1350° C., for example. Coordinates denoted by square symbols in FIGS. 4A and 4B correspond to known compositions with which a spinel crystal structure is likely to be mixed.

For example, a compound represented by $ZnM_2O_4$, such as $ZnGa_2O_4$, is known as having a spinel crystal structure, for example. Furthermore, for example, when a composition is in the neighborhood of $ZnGa_2O_4$ as illustrated in FIGS.

4A and 42B, that is, the ratio of x to y and z is close to 0:2:1, a spinel crystal structure is likely to be formed or mixed.

Here, the oxide 130 is preferably a CAAC-OS film. Furthermore, it is preferable that the CAAC-OS film have no spinel crystal structure in particular. In addition, to increase carrier mobility, the indium content is preferably increased. In the oxide 130 containing indium, the element M, and zinc, the s orbital of heavy metal mainly contributes to carrier transfer, and when the indium content in the oxide 130 is increased, overlaps of the s orbitals of In atoms are increased; therefore, an oxide having a high content of indium has higher mobility than an oxide having a low content of indium. Therefore, an oxide having a high content of indium is used as the oxide 130, whereby carrier mobility can be increased.

Accordingly, the atomic ratio of indium to the element M and zinc, x:y:z, of the oxide 130 is preferably within the range of an area 11 shown in FIG. 4B, for example. Here, the area 11 includes atomic ratios within the range of an area surrounded by line segments that connect first coordinates K (x:y:z=8:14:7), second coordinates L (x:y:z=2:5:7), third coordinates M (x:y:z=51:149:300), fourth coordinates N (x:y:z=46:288:833), fifth coordinates O (x:y:z=0:2:11), sixth coordinates P (x:y:z=0:0:1), and seventh coordinates Q (x:y:z=1:0:0), in this order. Note that the area 11 also includes coordinates positioned on the straight line.

When x:y:z is within the area 11 in FIG. 4B, a spinel crystal structure is not observed or is hardly observed by nanobeam diffraction. Thus, an excellent CAAC-OS film can be obtained. Furthermore, carrier scattering or the like at the boundary between a CAAC structure and a spinel crystal structure can be reduced; therefore, when the oxide 130 is used for a transistor, the transistor can have high field-effect mobility. In addition, the transistor can have high reliability.

Influence of impurities in the oxide 130 is described below. In order to obtain stable electrical characteristics of a transistor, it is effective to reduce the concentration of impurities in the oxide 130 to have lower carrier density so that the oxide 130 is highly purified. The carrier density of the oxide 130 is set to be higher than or equal to $1 \times 10^{-9}/cm^3$, and lower than $8 \times 10^{11}/cm^3$, preferably lower than $1 \times 10^{11}/cm^3$, further preferably lower than $1 \times 10^{10}/cm^3$. In order to reduce the concentration of impurities in the oxide 130, the concentration of impurities also in a film adjacent to the oxide 130 is preferably reduced.

When nitrogen is contained in the oxide 130, the carrier density is increased in some cases. The concentration of nitrogen in the oxide 130 measured by SIMS is set to be lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

When hydrogen is contained in the oxide 130, the carrier density is increased in some cases. Furthermore, hydrogen contained in the oxide 130 as an impurity is moved to the surface of the oxide and bonds to oxygen near the surface, whereby a water molecule is formed and released in some cases. At this time, oxygen vacancy Vo is formed at the position of O released as a water molecule. For this reason, it is preferable to reduce sufficiently the concentration of hydrogen in the oxide 130. Therefore, the amount of water molecules in the oxide 130 detected by thermal desorption spectroscopy (TDS) (converted into the number of water molecules) is $1.0 \times 10^{21}/cm^3$ ($1.0/nm^3$) or less, preferably $1.0 \times 10^{20}/cm^3$ ($0.1/nm^3$) or less at a substrate surface temperature ranging from 100° C. to 700° C. or 100° C. to 500° C.

Here, the method of measuring the number of released water molecules using TDS analysis is described below.

The total amount of released gas from a measurement sample in TDS analysis is proportional to the integral value of the ion intensity of the released gas. Then, comparison with a reference sample is made, whereby the total amount of released gas can be calculated.

For example, the number of released oxygen molecules ($N_{H2O}$) from a measurement sample can be calculated according to the following formula using the TDS results of a silicon substrate containing hydrogen at a predetermined density, which is a standard sample, and the TDS results of the measurement sample. Here, all gases having a mass-to-charge ratio of 18 which are obtained in the TDS analysis are assumed to originate from a water molecule. Note that CH$_4$, which is a gas having the mass-to-charge ratio of 18, is not taken into consideration because it is unlikely to be present. Furthermore, a water molecule including a hydrogen molecule having a mass number of 2 or 3 which is an isotope of hydrogen and a water molecule including an oxygen atom having a mass number of 17 or 18 which is an isotope of an oxygen atom are not taken into consideration either because the proportion of such a molecule in the natural world is minimal.

$$N_{H2O} = \frac{N_{H2}}{S_{H2}} \times S_{H2O} \times \alpha \qquad \text{[Formula 1]}$$

The value $N_{H2}$ is obtained by conversion of the amount of hydrogen molecules desorbed from the standard sample into densities. The value $S_{H2}$ is the integral value of ion intensity in the case where the standard sample is subjected to the TDS analysis. Here, the reference value of the standard sample is set to $N_{H2}/S_{H2}$. The value $S_{H2O}$ is the integral value of ion intensity in the case where the measurement sample is subjected to the TDS analysis. The value α is a coefficient affecting the ion intensity in the TDS analysis. Refer to Japanese Published Patent Application No. H06-275697 for details of the above formula. The amount of released oxygen was measured with a thermal desorption spectroscopy apparatus produced by ESCO Ltd., EMD-WA1000S/W, using a silicon substrate containing a certain amount of hydrogen atoms as the standard sample.

Note that $N_{H2O}$ is the number of the released water molecules. The number of released water molecules converted into hydrogen atoms is twice the number of the released water molecules.

Hydrogen as an impurity in the oxide is in the state of a hydrogen atom, a hydrogen ion, a hydrogen molecule, a hydroxyl group, a hydroxide ion, or the like, and it is difficult for hydrogen to exist as a water molecule.

When an oxide including a crystal with sufficiently reduced hydrogen concentration is used for a channel formation region in a transistor, the transistor can have stable electrical characteristics. That is, a change in electrical characteristics can be inhibited and reliability can be improved. Furthermore, a semiconductor device with low power consumption can be provided.

The semiconductor device in FIG. 1A may be provided with a barrier film in addition to the insulator 160 between the oxide 130 and the electrode 170.

Alternatively, the insulator 130c may have a barrier property. In addition, a base film may be formed over the substrate 101. In addition to the base film, a barrier film may be stacked. Furthermore, an interlayer film is provided to cover the transistor 100. In addition to the interlayer film, a barrier film or the like may be stacked.

As the barrier film, an insulating film having barrier properties against oxygen and hydrogen is preferably used. As for such an insulator, aluminum oxide, aluminum oxynitride, gallium oxide, gallium oxynitride, yttrium oxide, yttrium oxynitride, hafnium oxide, hafnium oxynitride, silicon nitride, or the like can be used as examples. When such a material is used, the barrier film has a function of suppressing a release of oxygen from the oxide 130 and diffusion of oxygen to portions other than the oxide 130 from the insulating film 120, and also has a function of preventing entry of impurities such as hydrogen from the outside.

The insulating film containing excess oxygen is provided in contact with the oxide 130 and surrounded by the barrier films, whereby the composition of the oxide can be almost the same as the stoichiometric composition or in a supersaturated state containing more oxygen than the stoichiometric composition. It is also possible to prevent entry of impurities such as hydrogen into the oxide 130.

<Structure Example 2 of Semiconductor Device>

Figure 2A:
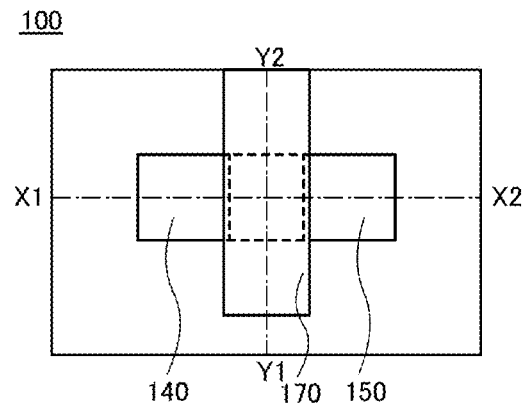
FIG. 2A is a top view and FIGS. 2B to 2D are cross-sectional views illustrating one embodiment of a semiconductor device.
Figure 2B:
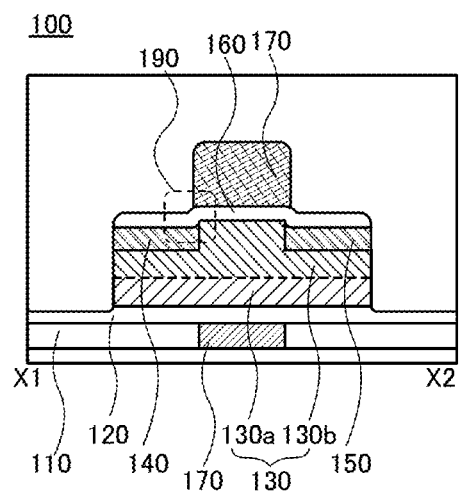
Figure 2C:
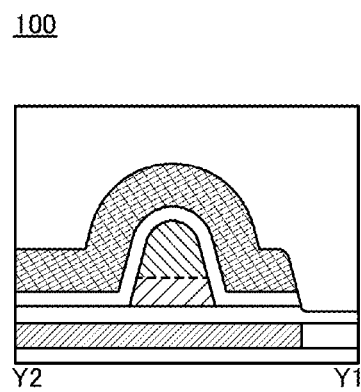
Figure 2D:
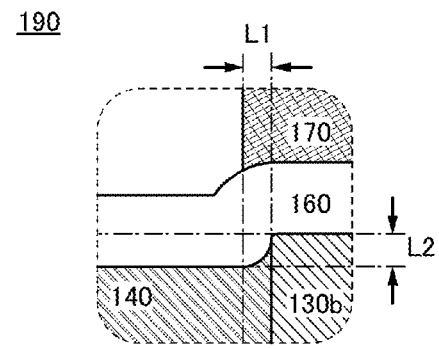

FIG. 2A illustrates an example of a top view of a transistor 100 which is different from that in the structure example 1 of a semiconductor device. For simplicity, some films are not illustrated in FIG. 2A. FIG. 2B is a cross-sectional view taken along the dashed-dotted line X1-X2 in FIG. 2A, and FIG. 2C is a cross-sectional view taken along the dashed-dotted line Y1-Y2 in FIG. 2A. FIG. 2D is an enlarged view of a region 190 in FIG. 2B.

The transistor 100 provided over the substrate 101 includes the electrodes 175 and 170 functioning as gate electrodes, the oxide 130 including a region where a channel is to be formed, the electrode 140 functioning as one of a source and a drain, the electrode 150 functioning as the other of the source and the drain, and the insulator 160 functioning as a gate insulating layer. The oxide 130 includes the insulator 130a and the semiconductor 130b over the insulator 130a.

In the structure of the transistor 100 in FIG. 2D, a region where an edge of the electrode 170 overlaps with an edge of the electrode 140 (also referred to as Lov), a length L1 in FIG. 2D, is longer than or equal to 0 nm and shorter than or equal to 5 nm, preferably longer than or equal to 0 nm and shorter than or equal to 1 nm. With this structure, even if parasitic capacitance is formed in a region where the electrode 170 overlaps with the electrode 140, the parasitic capacitance can be negligible. Note that the electrode 150 has the same structure as the electrode 140.

A difference in level between the top surface of the electrode 150 and the top surface of the region where a channel is to be formed, a length L2 in FIG. 2D, is longer than or equal to 0 nm and shorter than or equal to 10 nm, preferably longer than or equal to 0 nm and shorter than or equal to 5 nm. This structure does not have a difference in level between the region where a channel is to be formed and the electrode 170; thus, the insulator 130c and the insulator 160 over the region where a channel is to be formed can be provided without crossing over a difference in level.

The region where a channel is to be formed can be uniformly applied with a voltage in the above structure; therefore, a transistor in which leakage current is suppressed can be provided. With the use of a metal for the electrodes 140 and 150, a transistor with high on-state characteristics can be driven. Therefore, a transistor with high and stable electrical characteristics can be provided even when the transistor is miniaturized.

The above structure can provide a transistor with small parasitic capacitance because the shortest distance between the top surface of the region where a channel is to be formed and the electrode 170 is equal to or shorter than the shortest distance between the electrode 170 and the electrode 140 or 150.

<Modification Example 1 of Semiconductor Device>

FIGS. 3A to 3E are cross-sectional views each illustrating a modification example of the transistor 100.

Figure 3A:
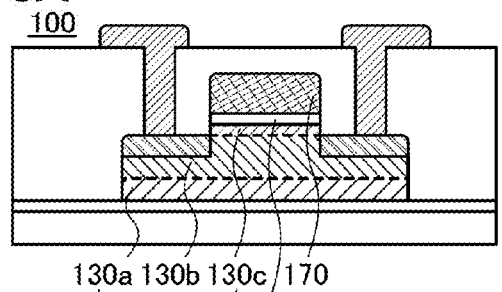
FIGS. 3A to 3E are cross-sectional views illustrating one embodiment of a semiconductor device.
Figure 3B:
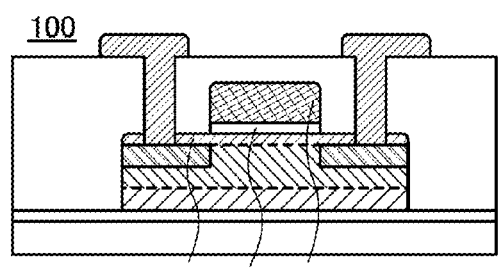
Figure 3C:
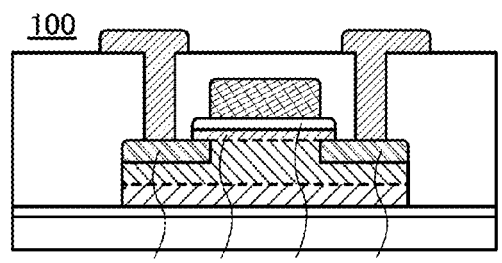

The insulators 160 and 130c may be provided so that the edges thereof are aligned with the edges of the electrode 170 as shown in FIG. 3A. It is also acceptable that the edges of the insulator 160 correspond to the edges of the electrode 170 and the edges of the insulator 130c are positioned outside the edges of the insulator 160 or the edges of the electrode as shown in FIG. 3B. Furthermore, it is acceptable that the edges of the insulator 130c correspond to the edges of the insulator 160 and the edges of the electrode 170 are positioned inside the edges of the insulator 130c or the edges of the insulator 160 as shown in FIG. 3C.

Figure 3D:
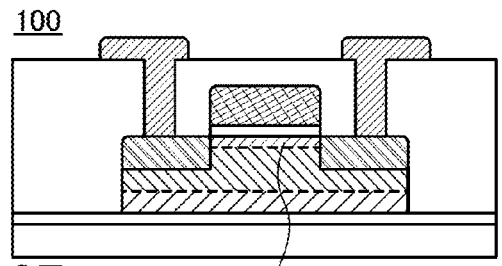

The top surface of the insulator 130c may be at the same level as the top surfaces of the electrodes 140 and 150 as shown in FIG. 3D. In that case, a surface where the insulator 130c and the insulator 160 are in contact with each other is on the same plane as the top surfaces of the electrodes 140 and 150. Alternatively, the top surfaces of the electrodes 140 and 150 are positioned closer to the insulator 130a than the surface where the insulator 130c and the insulator 160 are in contact with each other.

Figure 3E:
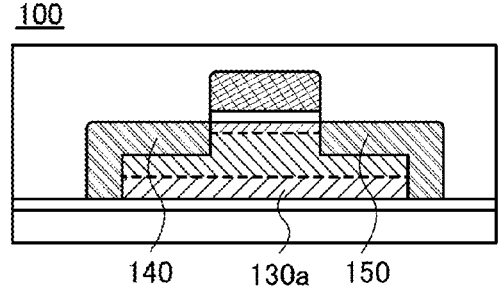

As shown in FIG. 3E, the electrodes 140 and 150 may partly cover the sides of the semiconductor 130b or the insulator 130a.

In this embodiment, one embodiment of the present invention has been described. Other embodiments of the present invention are described in the other embodiments. Note that one embodiment of the present invention is not limited thereto. That is, since various embodiments of the invention are disclosed in this embodiment and the other embodiments, one embodiment of the present invention is not limited to a specific embodiment. For example, an example in which a channel formation region, source and drain regions, and the like of the transistor 100 include an oxide semiconductor is described as one embodiment of the present invention; however, one embodiment of the present invention is not limited thereto. Depending on circumstances or conditions, a channel formation region, a source region, a drain region, or the like of the transistor 100 in one embodiment of the present invention may include various semiconductors. Depending on circumstances or conditions, for example, at least one of silicon, germanium, silicon germanium, silicon carbide, gallium arsenide, aluminum gallium arsenide, indium phosphide, gallium nitride, an organic semiconductor, and the like may be included in a channel formation region, a source region or a drain region, or the like of the transistor 100 of one embodiment of the present invention. Alternatively, depending on circumstances or conditions, an oxide semiconductor is not necessarily included in a channel formation region, a source region or a drain region, or the like of the transistor 100 of one embodiment of the present invention, for example.

(Embodiment 2)

<Structure of Oxide Semiconductor>

A structure of an oxide semiconductor will be described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 5A:
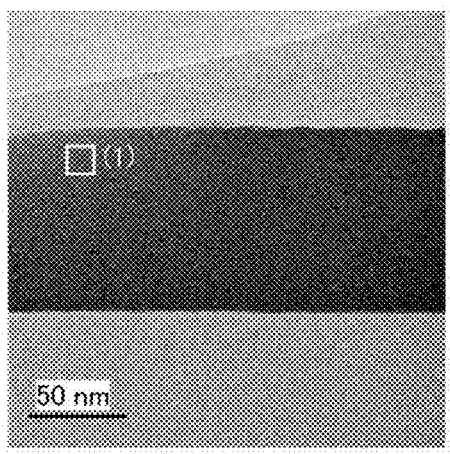
FIGS. 5A to 5C are Cs-corrected high-resolution TEM images of a cross section of a CAAC-OS and FIG. 5D is a cross-sectional schematic view of the CAAC-OS.
Figure 5B:
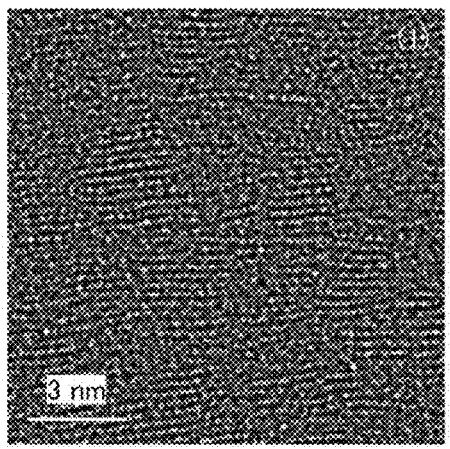

The CAAC-OS observed with a TEM is described below. FIG. 5A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. Note that the Cs-corrected high-resolution TEM image can be obtained with, for example, an atomic resolution analytical electron microscope JEM-ARM200F manufactured by JEOL Ltd. FIG. 5B is an enlarged Cs-corrected high-resolution TEM image of a region (1) in FIG. 5A. FIG. 5B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 5C:
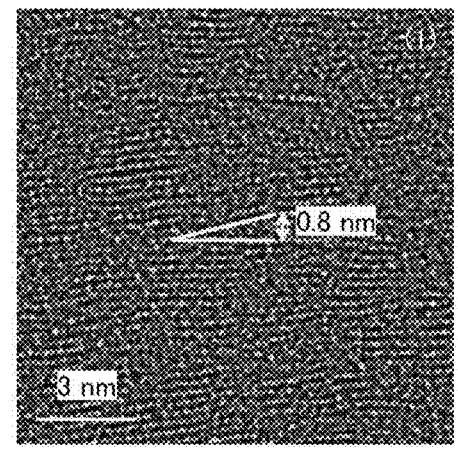

As shown in FIG. 5B, the CAAC-OS has a characteristic atomic arrangement. The characteristic atomic arrangement is denoted by an auxiliary line in FIG. 5C. FIGS. 5B and 5C prove that the size of a pellet is greater than or equal to 1 nm, or greater than or equal to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 5D:
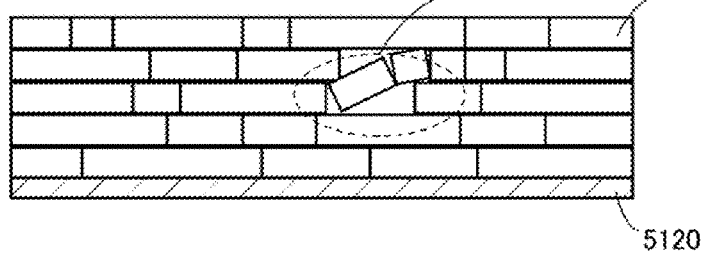

Here, according to the Cs-corrected high-resolution TEM images, the schematic arrangement of pellets 5100 of a CAAC-OS over a substrate 5120 is illustrated by such a structure in which bricks or blocks are stacked (see FIG. 5D). The part in which the pellets are tilted as observed in FIG. 5C corresponds to a region 5161 shown in FIG. 5D.

Figure 6A:
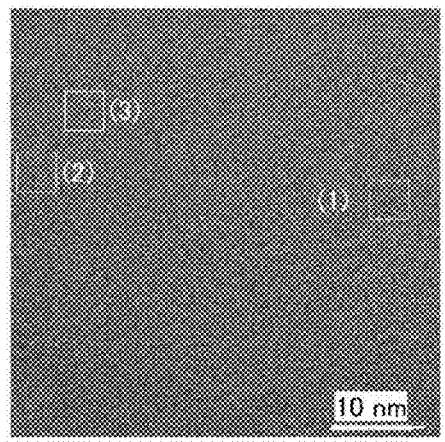
FIGS. 6A to 6D are Cs-corrected high-resolution TEM images of a plane of a CAAC-OS.
Figure 6B:
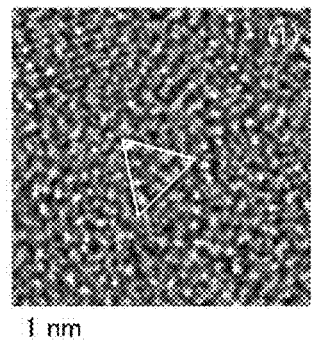
Figure 6C:
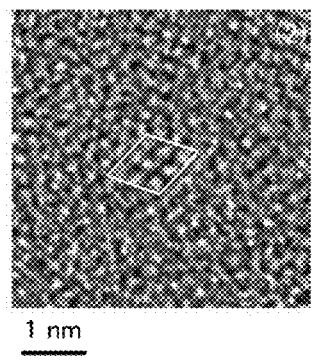
Figure 6D:
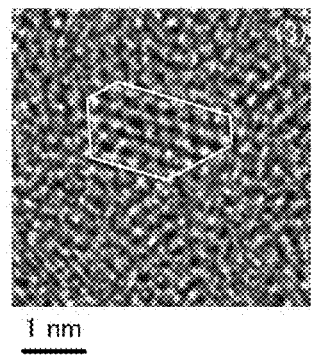

FIG. 6A shows a Cs-corrected high-resolution TEM image of a plane of the CAAC-OS observed from a direction substantially perpendicular to the sample surface. FIGS. 6B, 6C, and 6D are enlarged Cs-corrected high-resolution TEM images of regions (1), (2), and (3) in FIG. 6A, respectively. FIGS. 6B, 6C, and 6D indicate that metal atoms are arranged in a triangular, quadrangular, or hexagonal configuration in a pellet. However, there is no regularity of arrangement of metal atoms between different pellets.

Figure 7A:
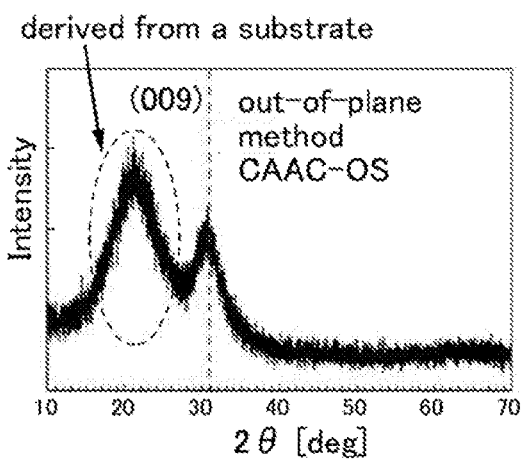
FIGS. 7A to 7C show structural analysis of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle (2θ) of around 31° as shown in FIG. 7A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak of 2θ at around 36° indicates that a crystal having no c-axis alignment is included in part of the CAAC-OS. In a preferable CAAC-OS whose structure is analyzed by an out-of-plane method, a peak appears when 2θ is around 31° and no peak appears when 2θ is around 36°.

Figure 7B:
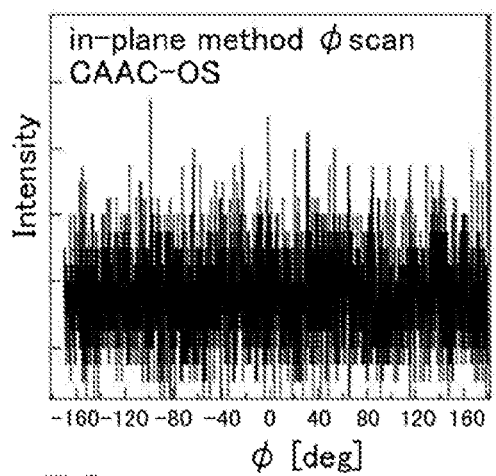
Figure 7C:
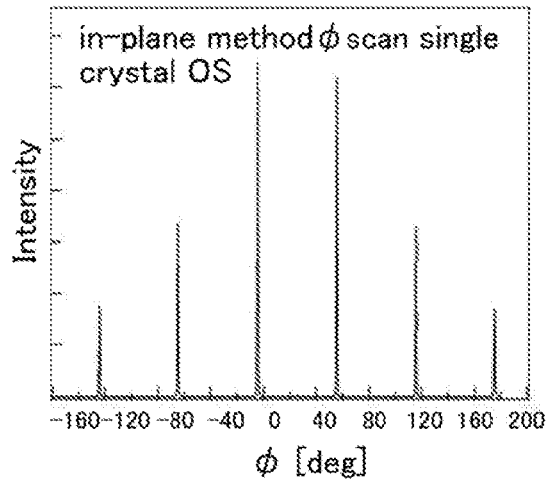

On the other hand, in structural analysis of the CAAC-OS by an in-plane method in which an X-ray is incident on a sample in a direction substantially perpendicular to the c-axis, a peak appears when 2θ is around 56°. This peak is derived from the (110) plane of the $InGaZnO_4$ crystal. In the case of the CAAC-OS, when analysis (φ scan) is performed with 2θ fixed at around 56° and with the sample rotated using a normal vector of the sample surface as an axis (φ axis), as shown in FIG. 7B, a peak is not clearly observed. In contrast, in the case of a single crystal oxide semiconductor of $InGaZnO_4$, when φ scan is performed with 2θ fixed at around 56°, as shown in FIG. 7C, six peaks which are derived from crystal planes equivalent to the (110) plane are observed. Accordingly, the structural analysis using XRD shows that the directions of a-axes and b-axes are irregularly oriented in the CAAC-OS.

Figure 8A:
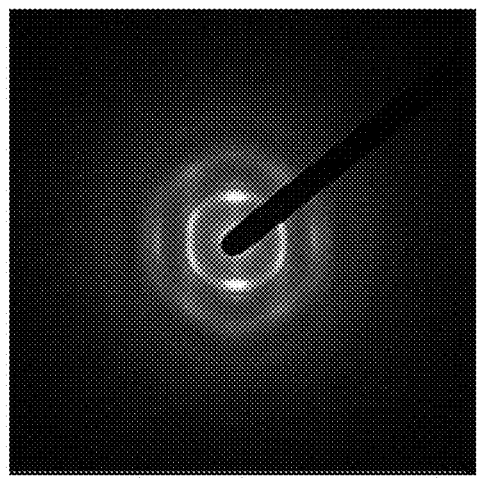
FIGS. 8A and 8B show electron diffraction patterns of a CAAC-OS.
Figure 8B:
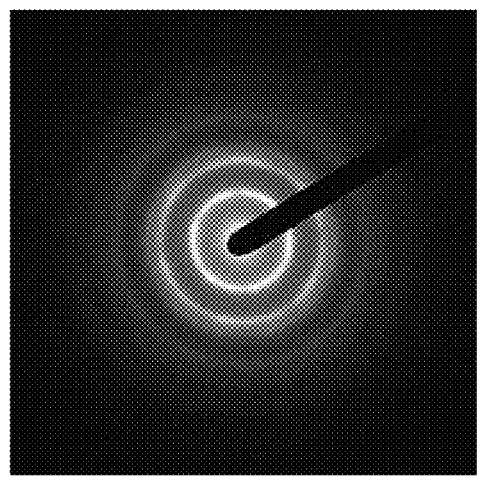

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 8A can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 8B shows a diffraction pattern obtained in such a manner that an electron beam with a probe diameter of 300 nm is incident on the same sample in a direction perpendicular to the sample surface. As shown in FIG. 8B, a ring-like diffraction pattern is observed. Thus, the electron diffraction also indicates that the a-axes and b-axes of the pellets included in the CAAC-OS do not have regular alignment. The first ring in FIG. 8B is considered to be derived from the (010) plane, the (100) plane, and the like of the $InGaZnO_4$ crystal. The second ring in FIG. 8B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has negligible amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density (specifically, lower than $8\times10^{11}/cm^3$, preferably lower than $1\times10^{11}/cm^3$, further preferably lower than $1\times10^{19}/cm^3$, and is higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. An oxide semiconductor including a crystal part whose size is greater than 10 nm and less than or equal to 100 nm can be referred to as a microcrystalline oxide semiconductor. In a high-resolution TEM image of the nc-OS film, for example, a grain boundary is not always found clearly. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane cannot be detected. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS layer, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (sample A), an nc-OS (sample B), and a CAAC-OS (sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of the $InGaZnO_4$ crystal has a structure in which nine layers including three In-O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$. Each of lattice fringes corresponds to the a-b plane of the $InGaZnO_4$ crystal.

Figure 9:
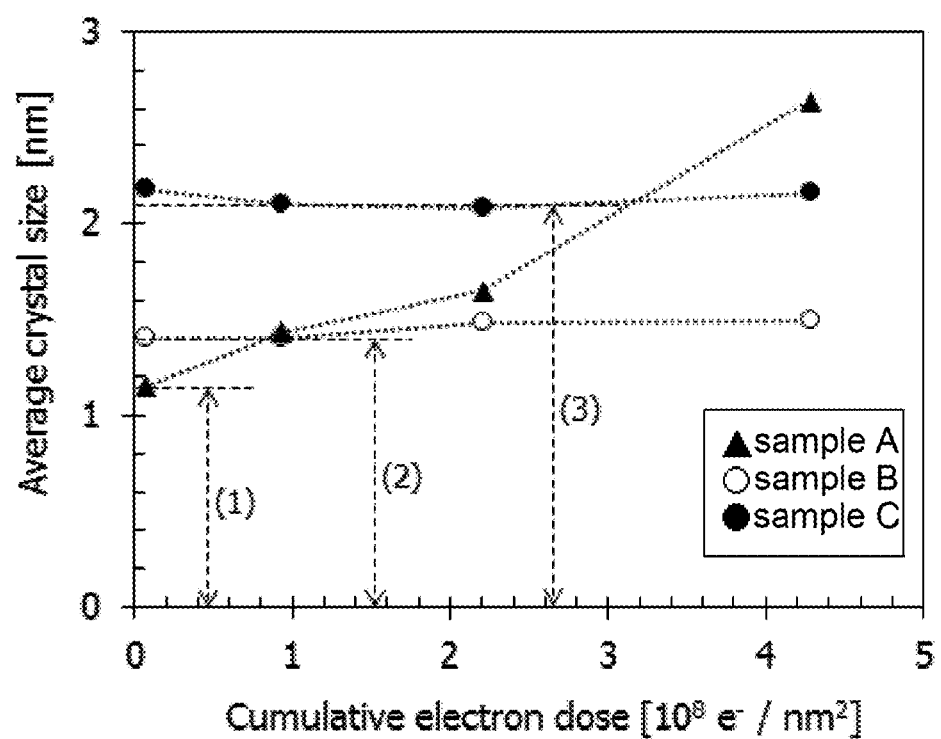
FIG. 9 shows changes in crystal parts of an In—Ga—Zn oxide by electron irradiation.

FIG. 9 shows change in the average size of crystal parts (at 22 points to 45 points) in each sample. Note that the crystal part size corresponds to the length of a lattice fringe.

FIG. 9 indicates that the crystal part size in the a-like OS increases with an increase in the cumulative electron dose. Specifically, as shown by (1) in FIG. 9, a crystal part of approximately 1.2 nm (also referred to as an initial nucleus) at the start of TEM observation grows to a size of approximately 2.6 nm at a cumulative electron dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. Specifically, as shown by (2) and (3) in FIG. 9, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor layer having a density of lower than 78% of the density of the single crystal oxide semiconductor layer.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that single crystals with the same composition do not exist in some cases. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

(Embodiment 3)

In this embodiment, a structure example of a semiconductor device including the transistor of one embodiment of the present invention will be described with reference to drawings.

[Cross-Sectional Structure]

FIGS. 10A and 10B are cross-sectional views of a semiconductor device of one embodiment of the present invention. The semiconductor device illustrated in FIGS. 10A and 10B includes a transistor 2200 containing a first semiconductor material in a lower portion and a transistor 2100 containing a second semiconductor material in an upper portion. FIG. 10A illustrates a cross-sectional view of the transistors in the channel length direction, and FIG. 10B illustrates a cross-sectional view of the transistors in the channel width direction.

Note that the transistor 2100 may be provided with a back gate.

The first and second semiconductor materials preferably have different energy gaps. For example, the first semiconductor material can be a semiconductor material other than an oxide semiconductor (examples of such a semiconductor material include silicon (including strained silicon), germanium, silicon germanium, silicon carbide, gallium arsenide, aluminum gallium arsenide, indium phosphide, gallium nitride, and an organic semiconductor), and the second semiconductor material can be an oxide semiconductor. A transistor using a material other than an oxide semiconductor, such as single crystal silicon, can operate at high speed easily. On the other hand, a transistor including an oxide semiconductor has a low off-state current.

The transistor 2200 may be either an n-channel transistor or a p-channel transistor, and an appropriate transistor may be used in accordance with a circuit. Furthermore, the specific structure of the semiconductor device, such as the material or the structure used for the semiconductor device, is not necessarily limited to those described here except for the use of the transistor of one embodiment of the present invention which uses an oxide semiconductor.

FIGS. 10A and 10B illustrate a structure in which the transistor 2100 is provided over the transistor 2200 with an insulating film 2201 and an insulating film 2207 provided therebetween. A plurality of wirings 2202 are provided between the transistor 2200 and the transistor 2100. Furthermore, wirings and electrodes provided over and under the insulating films are electrically connected to each other through a plurality of plugs 2203 embedded in the insulating films. An interlayer insulating film 2204 covering the transistor 2100 is provided.

The stack of the two kinds of transistors reduces the area occupied by the circuit, allowing a plurality of circuits to be highly integrated.

Here, in the case where a silicon-based semiconductor material is used for the transistor 2200 provided in a lower portion, hydrogen in an insulating film provided in the vicinity of the semiconductor film of the transistor 2200 terminates dangling bonds of silicon; accordingly, the reliability of the transistor 2200 can be improved.

Meanwhile, in the case where an oxide semiconductor is used for the transistor 2100 provided in an upper portion, hydrogen in an insulating film provided in the vicinity of the semiconductor film of the transistor 2100 becomes a factor of generating carriers in the oxide semiconductor; thus, the reliability of the transistor 2100 might be decreased. Therefore, in the case where the transistor 2100 using an oxide semiconductor is provided over the transistor 2200 using a silicon-based semiconductor material, it is particularly effective that the insulating film 2207 having a function of preventing diffusion of hydrogen is provided between the transistors 2100 and 2200. The insulating film 2207 makes hydrogen remain in the lower portion, thereby improving the reliability of the transistor 2200. In addition, since the insulating film 2207 suppresses diffusion of hydrogen from the lower portion to the upper portion, the reliability of the transistor 2100 also can be improved.

The insulating film 2207 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Furthermore, a blocking film having a function of preventing entry of hydrogen may be formed over the transistor 2100 to cover the transistor 2100 including an oxide semiconductor film. For the blocking film, a material that is similar to that of the insulating film 2207 can be used, and in particular, aluminum oxide is preferably used. The aluminum oxide film has a high shielding (blocking) effect of preventing penetration of both oxygen and impurities such as hydrogen and moisture. Thus, by using the aluminum oxide film as the blocking film covering the transistor 2100, release of oxygen from the oxide semiconductor film included in the transistor 2100 and entry of water and hydrogen into the oxide semiconductor film can be prevented.

Note that the transistor 2200 can be a transistor of various types without being limited to a planar type transistor. For example, a FIN-type transistor, a TRI-GATE transistor, or the like can be used. An example of a cross-sectional view in this case is shown in FIGS. 10E and 10F. An insulating film 2212 is provided over a semiconductor substrate 2211. The semiconductor substrate 2211 includes a projecting portion with a thin tip (also referred to as a fin). Note that an insulating film may be provided over the projecting portion. The insulating film functions as a mask for preventing the semiconductor substrate 2211 from being etched when the projecting portion is formed. Alternatively, the projecting portion may not have the thin tip; a projecting portion with a cuboid-like projecting portion and a projecting portion with a thick tip are permitted, for example. A gate insulating film 2214 is provided over the projecting portion of the semiconductor substrate 2211, and a gate electrode 2213 is provided over the gate insulating film 2214. Although the gate electrode 2213 has a single-layer structure in this embodiment, one embodiment of the present invention is not limited to this example, and the gate electrode 2213 may have a stacked-layer structure of two or more layers. Source and drain regions 2215 are formed in the semiconductor substrate 2211. Note that here is shown an example in which the semiconductor substrate 2211 includes the projecting portion; however, a semiconductor device of one embodiment of the present invention is not limited thereto. For example, a semiconductor region having a projecting portion may be formed by processing an SOI substrate.

[Circuit Configuration Example]

In the above structure, electrodes of the transistor 2100 and the transistor 2200 can be connected in a variety of ways; thus, a variety of circuits can be formed. Examples of circuit configurations which can be achieved by using a semiconductor device of one embodiment of the present invention are shown below.

A circuit diagram in FIG. 10C shows a configuration of what is called a CMOS circuit in which the p-channel transistor 2200 and the n-channel transistor 2100 are connected to each other in series and in which gates of them are connected to each other.

A circuit diagram in FIG. 10D shows a configuration in which sources of the transistors 2100 and 2200 are connected to each other and drains of the transistors 2100 and 2200 are connected to each other. With such a configuration, the transistors can function as a so-called analog switch.

Figure 11:
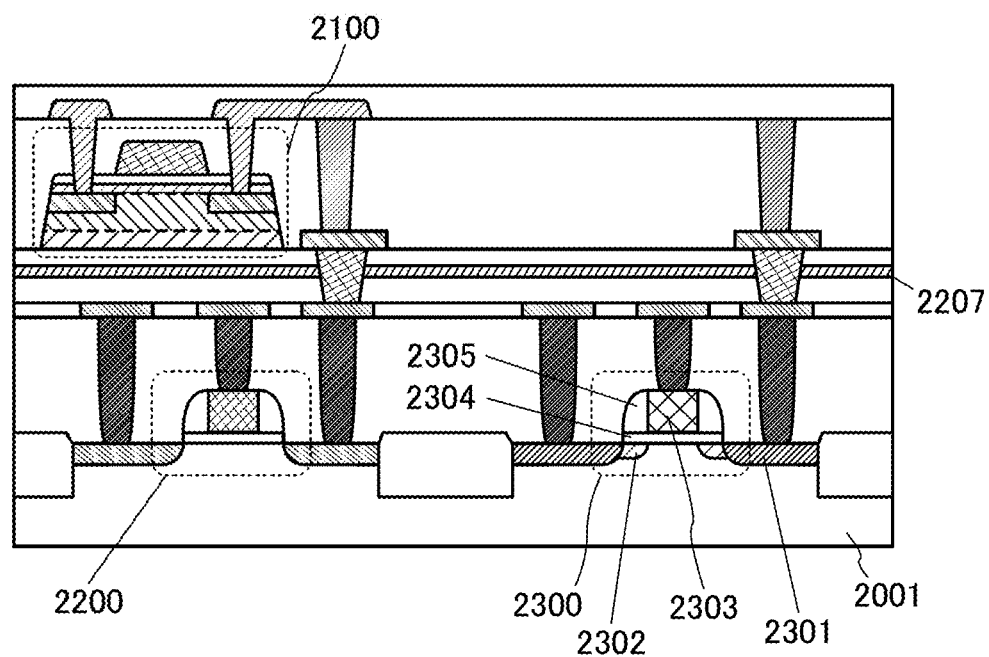
FIG. 11 is a cross-sectional view illustrating one embodiment of a semiconductor device.

FIG. 11 is a cross-sectional view of a semiconductor device in which a CMOS circuit includes a transistor 2200 and a transistor 2300 each having a channel formed using a first semiconductor material.

The transistor 2300 includes impurity regions 2301 serving as a source region or a drain region, a gate electrode 2303, a gate insulating film 2304, and a sidewall insulating film 2305. The transistor 2300 may also include an impurity region 2302 serving as an LDD region under the sidewall insulating film 2305. The description for FIGS. 10A and 10B can be referred to for the other components in FIG. 11.

The transistors 2200 and 2300 preferably have opposite polarities. For example, when the transistor 2200 is a p-channel transistor, the transistor 2300 is preferably an n-channel transistor.

A photoelectric conversion element such as a photodiode may be provided in the semiconductor devices illustrated in FIGS. 10A and 10B, and FIG. 11.

The photodiode can be formed using a single crystal semiconductor or a polycrystalline semiconductor. The photodiode formed using a single crystal semiconductor or a polycrystalline semiconductor is preferable because of its high light detection sensitivity.

Figure 12A:
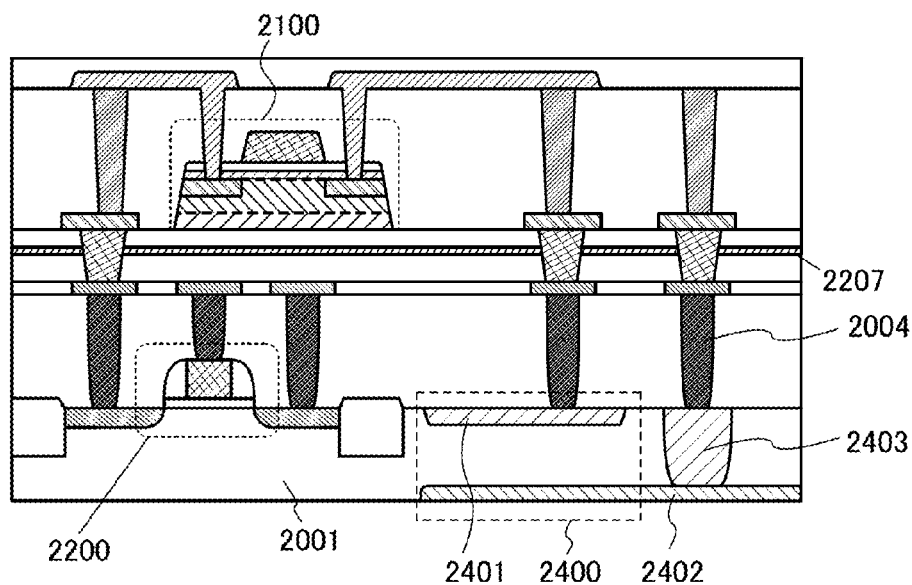
FIGS. 12A and 12B are cross-sectional views each illustrating one embodiment of a semiconductor device.

FIG. 12A is a cross-sectional view of the case of providing the substrate 2001 with a photodiode 2400. The photodiode 2400 includes a conductive film 2401 having a function as one of an anode and a cathode, a conductive film 2402 having a function as the other of the anode and the cathode, and a conductive film 2403 electrically connecting the conductive film 2402 and a plug 2004. The conductive films 2401 to 2403 may be formed by injecting an impurity in the substrate 2001.

Although the photodiode 2400 is provided so that a current flows in the vertical direction with respect to the substrate 2001 in FIG. 12A, the photodiode 2400 may be provided so that a current flows in the lateral direction with respect to the substrate 2001.

Figure 12B:
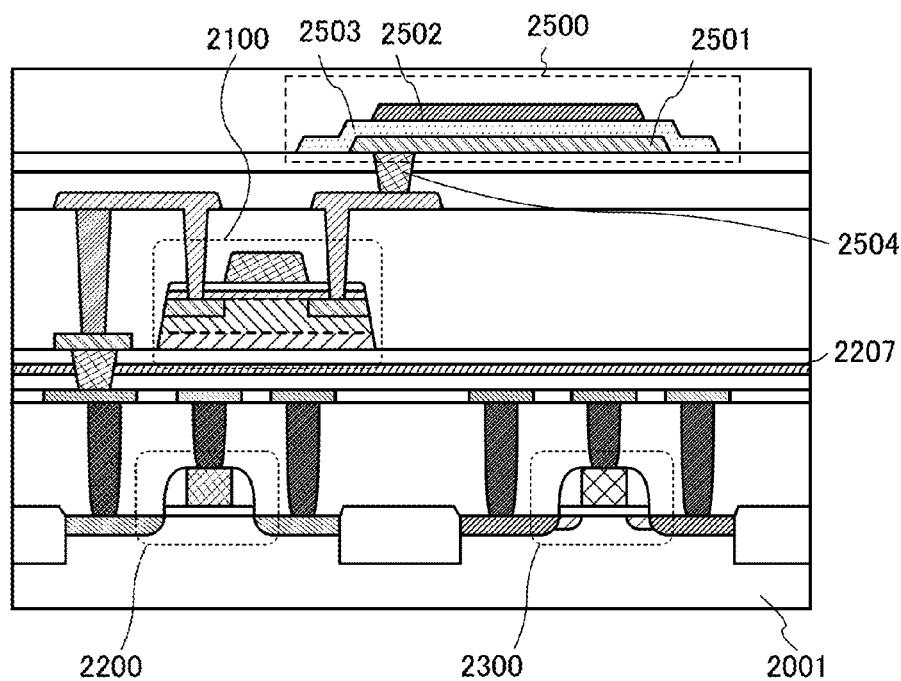

FIG. 12B is a cross-sectional view of a semiconductor device in which a photodiode 2500 is provided over the transistor 2100. The photodiode 2500 includes a conductive film 2501 having a function as one of an anode and a cathode, a conductive film 2502 having a function as the other of the anode and the cathode, and a semiconductor 2503. Furthermore, the photodiode 2500 is electrically connected to the transistor 2100 through a plug 2504.

In FIG. 12B, the photodiode 2500 may also be provided at the same level as the transistor 2100. Alternatively, the photodiode 2500 may be provided at the level between the transistor 2200 and the transistor 2100.

The description for FIGS. 10A and 10B, and FIG. 11 can be referred to for the details of other components in FIGS. 12A and 12B.

The photodiode 2400 or the photodiode 2500 may be formed using a material capable of generating charge by absorbing a radiation. Examples of a material capable of generating electrical charges by absorbing radiation include selenium, lead iodide, mercury iodide, gallium arsenide, CdTe, and CdZn.

The use of selenium for the photodiode 2400 or the photodiode 2500 can provide a photoelectric conversion element having a light absorption coefficient in a wide wavelength range of visible light, ultraviolet light, X-rays, and gamma rays, for example.

<Memory Device>

Figure 13A:
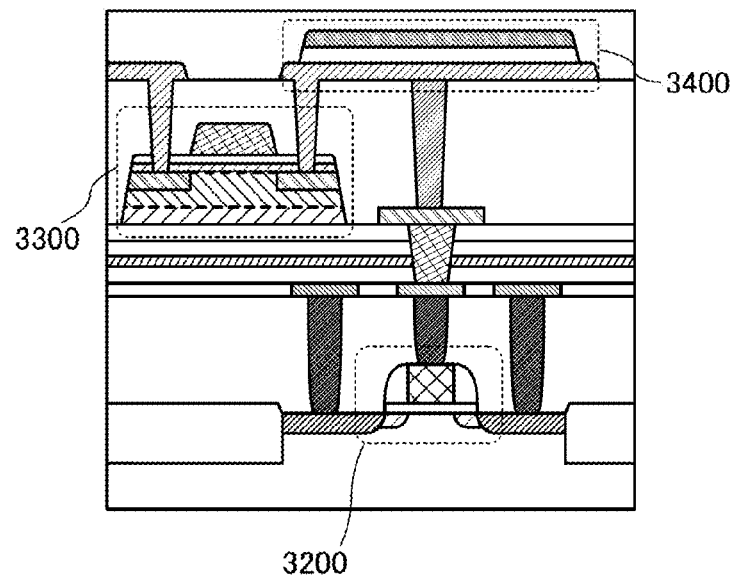
FIG. 13A is a cross-sectional view and FIGS. 13B and 13C are circuit diagrams illustrating embodiments of semiconductor devices.
Figure 13B:
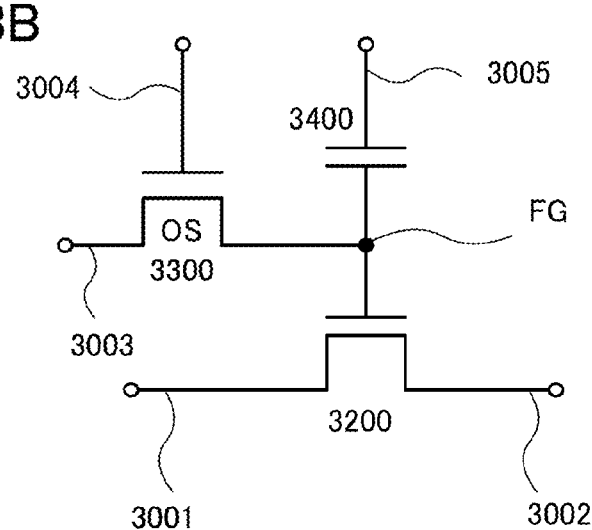
Figure 13C:
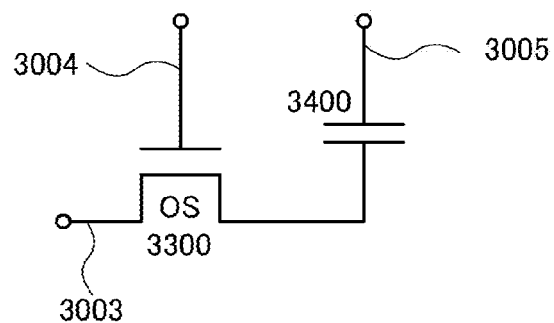

An example of a semiconductor device (memory device) which includes the transistor of one embodiment of the present invention, which can hold stored data even when not powered, and which has an unlimited number of write cycles is shown in FIGS. 13A to 13C. Note that FIG. 13B is a circuit diagram of the structure in FIG. 13A.

The semiconductor device illustrated in FIGS. 13A and 13B includes a transistor 3200 including a first semiconductor material, a transistor 3300 including a second semiconductor material, and a capacitor 3400. As the transistor 3300, the transistor described in Embodiment 1 can be used.

The transistor 3300 is a transistor in which a channel is formed in a semiconductor including an oxide semiconductor. Since the off-state current of the transistor 3300 is low, stored data can be held for a long period owing to such a transistor. In other words, power consumption can be sufficiently reduced because a semiconductor device in which refresh operation is unnecessary or the frequency of refresh operation is extremely low can be provided.

In FIG. 13B, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to a gate electrode of the transistor 3300. A gate electrode of the transistor 3200 and the other of the source electrode and the drain electrode of the transistor 3300 are electrically connected to one electrode of the capacitor 3400. A fifth wiring 3005 is electrically connected to the other electrode of the capacitor 3400.

The semiconductor device in FIG. 13A has a feature that the potential of the gate electrode of the transistor 3200 can be held, and thus enables writing, holding, and reading of data as follows.

Writing and holding of data will be described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, a predetermined charge is supplied to the gate of the transistor 3200 (writing). Here, charge for supplying either of two different potential levels (hereinafter referred to as low-level charge and high-level charge) is given. After that, the potential of the fourth wiring 3004 is set to a potential at which the transistor 3300 is turned off, so that the transistor 3300 is turned off. Thus, the charge supplied to the gate of the transistor 3200 is held (holding).

Since the off-state current of the transistor 3300 is extremely low, the charge of the gate of the transistor 3200 is held for a long time.

Next, reading of data will be described. An appropriate potential (a reading potential) is supplied to the fifth wiring 3005 while a predetermined potential (a constant potential) is supplied to the first wiring 3001, whereby the potential of the second wiring 3002 varies depending on the amount of charge held in the gate of the transistor 3200. This is because in general, when the transistor 3200 is an n-channel transistor, an apparent threshold voltage $V_{th\_H}$ in the case where a high-level charge is given to the gate electrode of the transistor 3200 is lower than an apparent threshold voltage $V_{th\_L}$ in the case where a low-level charge is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate of the transistor 3200 can be determined. For example, in the case where the high-level charge is supplied in writing, when the potential of the fifth wiring 3005 is $V_0$ ($>V_{th\_H}$), the transistor 3200 is turned on. In the case where the low-level charge is supplied in writing, even when the potential of the fifth wiring 3005 is $V_0$ ($<V_{th\_L}$), the transistor 3200 remains off. Therefore, the data stored in the gate of the transistor 3200 can be read by determining the potential of the second wiring 3002.

Note that in the case where memory cells are arrayed to be used, only data of a desired memory cell needs to be read. For example, the fifth wiring 3005 of memory cells from which data is not read may be supplied with a potential at which the transistor 3200 is turned off regardless of the state of the gate electrode, that is, a potential lower than $V_{th\_H}$, whereby only data of a desired memory cell can be read. Alternatively, the fifth wiring 3005 of memory cells from which data is not read may be supplied with a potential at which the transistor 3200 is turned on regardless of the state of the gate electrode, that is, a potential higher than $V_{th\_L}$, whereby only data of a desired memory cell can be read.

The semiconductor device illustrated in FIG. 13C is different from the semiconductor device illustrated in FIG. 13A in that the transistor 3200 is not provided. Also in this case, writing and holding of data can be performed in a manner similar to the above.

Next, reading of data in the semiconductor device illustrated in FIG. 13C is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the first terminal of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the first terminal of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the first terminal of the capacitor 3400 is $V_1$ and $V_0$ ($V_1 > V_0$), the potential of the third wiring 3003 in the case of holding the potential $V_1$ ($=(C_B \times V_{B0} + C \times V_1)/(C_B + C)$) is higher than the potential of the third wiring 3003 in the case of holding the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor material may be used for a driver circuit for driving a memory cell, and a transistor including the second semiconductor material may be stacked over the driver circuit as the transistor 3300.

When a transistor having a channel formation region formed using an oxide semiconductor and having extremely small off-state current is applied to the semiconductor device in this embodiment, the semiconductor device can store data for an extremely long period. In other words, power consumption can be sufficiently reduced because refresh operation becomes unnecessary or the frequency of refresh operation can be extremely low. Moreover, stored data can be held for a long period even when power is not supplied (note that a potential is preferably fixed).

Furthermore, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating film does not arise at all. In other words, the semiconductor device of the disclosed invention does not have a limit on the number of write cycles that is a problem in a conventional nonvolatile memory, and reliability thereof is drastically improved. Furthermore, data is written depending on the on state and the off state of the transistor, so that high-speed operation can be easily achieved.

The memory device described in this embodiment can also be used in an LSI such as a central processing unit (CPU), a digital signal processor (DSP), a custom LSI, or a programmable logic device (PLD), for example.

<CPU>

A CPU including a semiconductor device such as any of the above-described transistors or the above-described memory device is described below.

Figure 14:
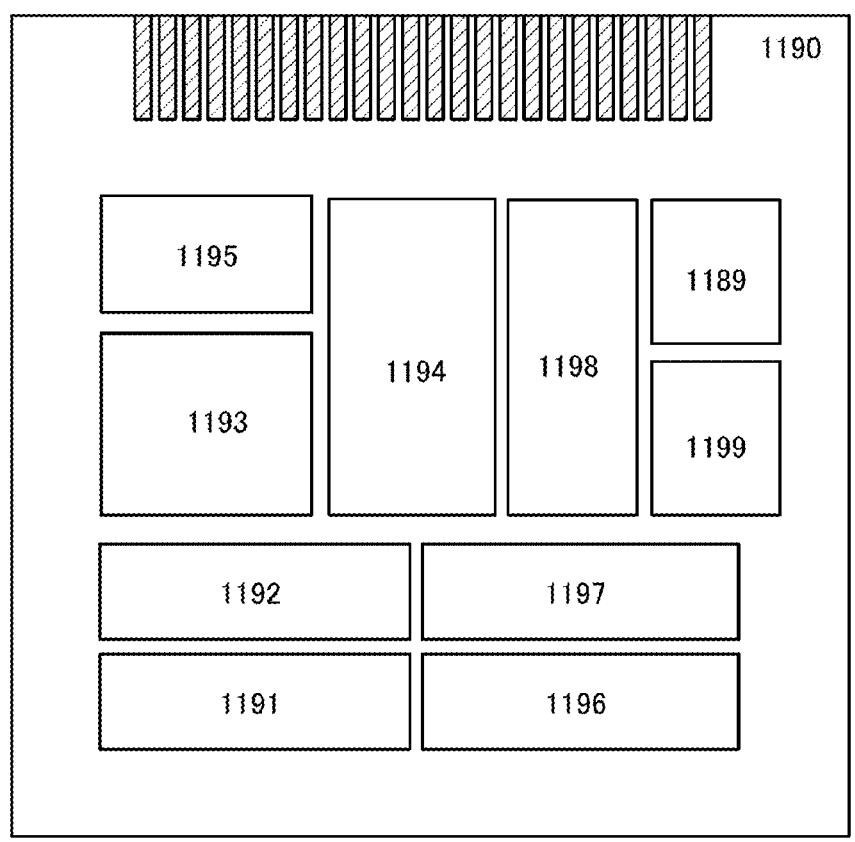
FIG. 14 is a block diagram illustrating a CPU of one embodiment of the present invention.

FIG. 14 is a block diagram illustrating a configuration example of a CPU including any of the above-described transistors as a component.

The CPU illustrated in FIG. 14 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189. A semiconductor substrate, an SOI substrate, a glass substrate, or the like is used as the substrate 1190. The ROM 1199 and the ROM interface 1189 may be provided over a separate chip. It is needless to say that the CPU in FIG. 14 is only an example in which the configuration is simplified, and actual CPUs have various configurations depending on the application. For example, the CPU may have the following configuration: a structure including the CPU illustrated in FIG. 14 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal on the basis of a reference clock signal, and supplies the internal clock signal to the above circuits.

In the CPU illustrated in FIG. 14, a memory cell is provided in the register 1196. For the memory cell of the register 1196, any of the above-described transistors, the above-described memory device, or the like can be used.

In the CPU illustrated in FIG. 14, the register controller 1197 selects an operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

Figure 15:
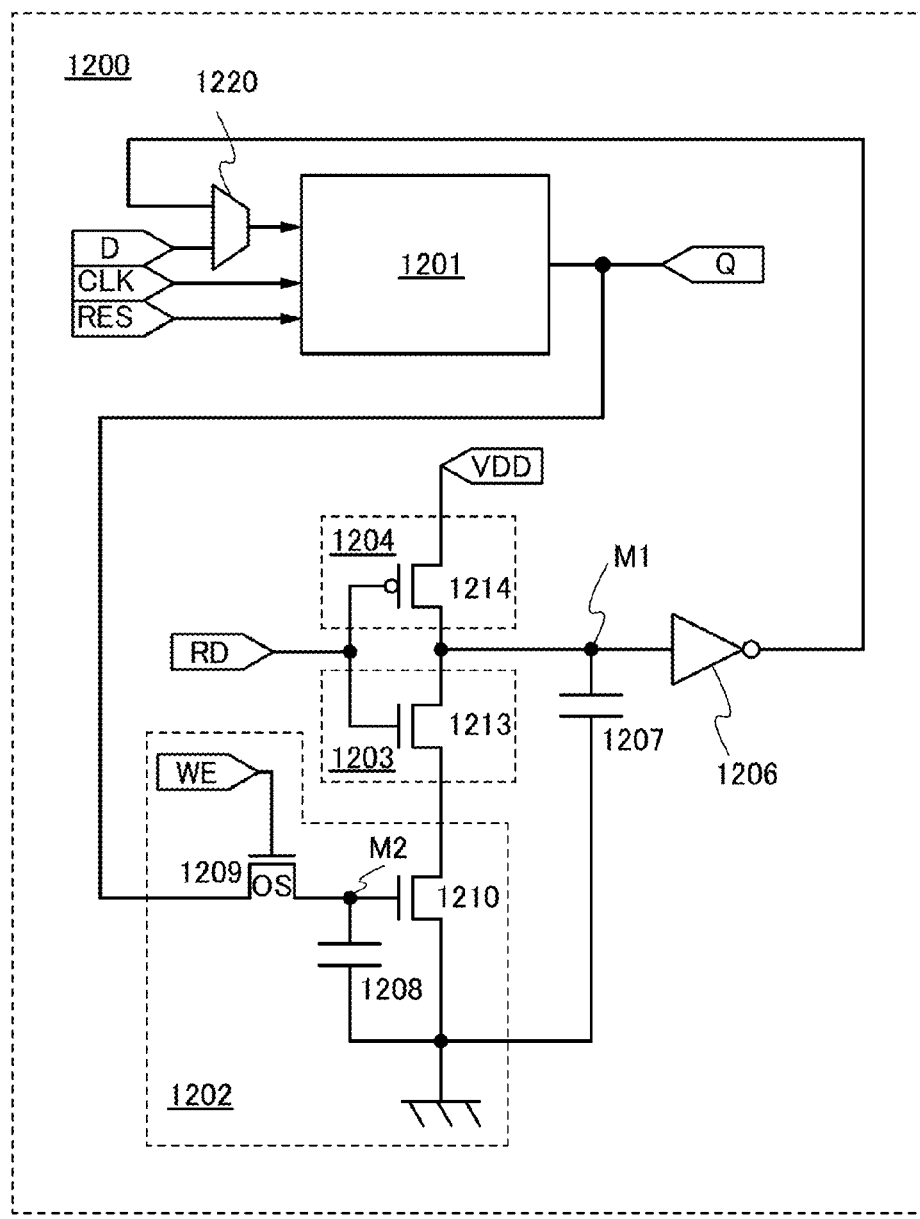
FIG. 15 is a circuit diagram illustrating a memory element of one embodiment of the present invention.

FIG. 15 is an example of a circuit diagram of a memory element that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of terminals of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of terminals of the capacitor 1207 are electrically connected to each other. Here, the connection portion is referred to as a node M1. The other of the pair of terminals of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of terminals of the capacitor 1207 is electrically connected to the line which can supply a low power supply potential (e.g., a GND line). The other of the pair of terminals of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of terminals of the capacitor 1208 is electrically connected to the line which can supply a low power supply potential (e.g., a GND line).

The capacitor 1207 and the capacitor 1208 are not necessarily provided as long as the parasitic capacitance or the like of the transistor or the wiring is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data held in the circuit 1201 is input to the other of the source and the drain of the transistor 1209. FIG. 15 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 15, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is held, the signal output from the second terminal of the switch 1203 (the other of the source and the drain of the transistor 1213) can be input to the node.

In FIG. 15, the transistors included in the memory element 1200 except for the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor can be included besides the transistor 1209, and a transistor in which a channel is formed in a layer using a semiconductor other than an oxide semiconductor or in the substrate 1190 can be used for the rest of the transistors.

As the circuit 1201 in FIG. 15, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can hold data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is held for a long time also in a period during which the power supply voltage is not supplied to the memory element 1200. The memory element 1200 can accordingly hold the stored content (data) also in a period during which the supply of the power supply voltage is stopped.

Since the above-described memory element performs pre-charge operation with the switch 1203 and the switch 1204, the time required for the circuit 1201 to hold original data again after the supply of the power supply voltage is restarted can be shortened.

In the circuit 1202, a signal held by the capacitor 1208 is input to the gate of the transistor 1210. Therefore, after supply of the power supply voltage to the memory element 1200 is restarted, the signal held by the capacitor 1208 can be converted into the one corresponding to the state (the on state or the off state) of the transistor 1210 to be read from the circuit 1202. Consequently, an original signal can be accurately read even when a potential corresponding to the signal held by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory element can be returned to the same state as that before the power supply is stopped. Therefore, the power supply can be stopped even for a short time in the processor or one or a plurality of logic circuits included in the processor. Accordingly, power consumption can be suppressed.

Although the memory element 1200 is used in a CPU, the memory element 1200 can also be used in an LSI such as a digital signal processor (DSP), a custom LSI, or a programmable logic device (PLD), and a radio frequency identification (RF-ID).

(Embodiment 4)

In this embodiment, a display device of one embodiment of the present invention will be described with reference to FIGS. 16A to 16C and FIGS. 17A and 17B.

Examples of a display element provided in the display device include a liquid crystal element (also referred to as a liquid crystal display element) and a light-emitting element (also referred to as a light-emitting display element). The light-emitting element includes, in its category, an element whose luminance is controlled by a current or voltage, and specifically includes, in its category, an inorganic electroluminescent (EL) element, an organic EL element, and the like. A display device including an EL element (EL display device) and a display device including a liquid crystal element (liquid crystal display device) are described below as examples of the display device.

Note that the display device described below includes in its category a panel in which a display element is sealed and a module in which an IC such as a controller is mounted on the panel.

The display device described below refers to an image display device or a light source (including a lighting device). The display device includes any of the following modules: a module provided with a connector such as an FPC or TCP; a module in which a printed wiring board is provided at the end of TCP; and a module in which an integrated circuit (IC) is mounted directly on a display element by a COG method.

Figure 16A:
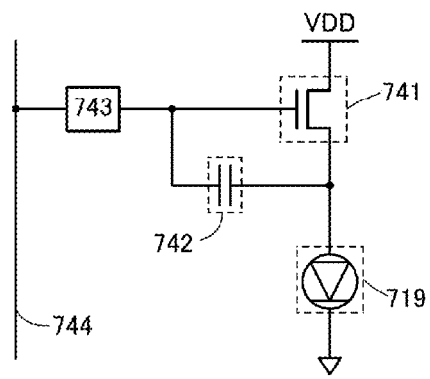
FIG. 16A is a circuit diagram.
Figure 16B:
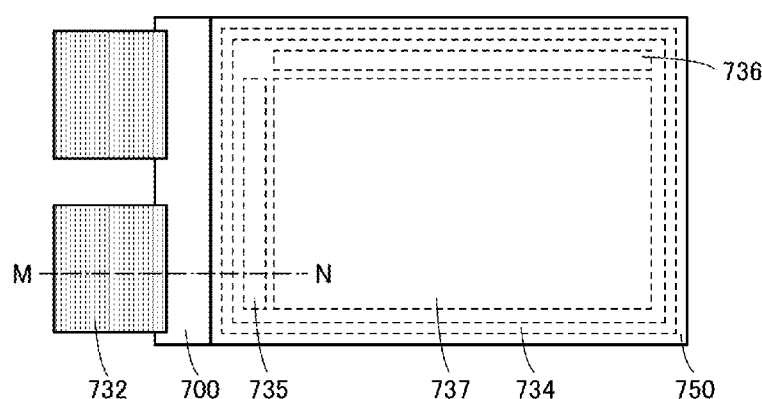
FIG. 16B is a top view.
Figure 16C:
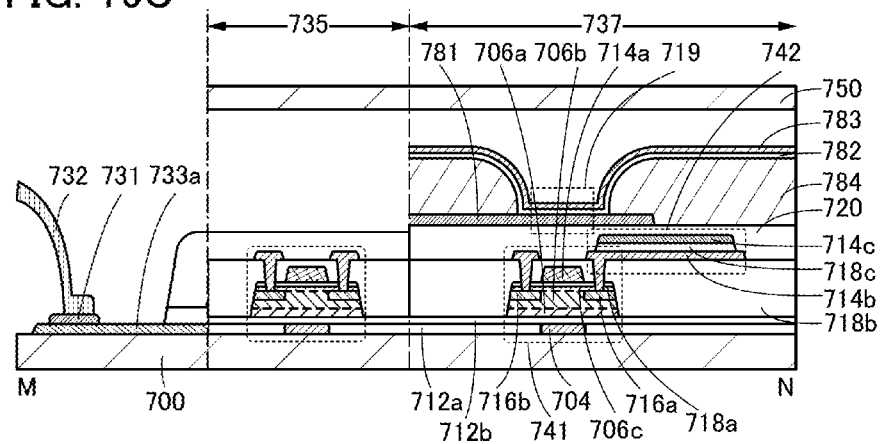
FIG. 16C is a cross-sectional view of a display device of one embodiment of the present invention.

FIGS. 16A to 16C show an example of an EL display device according to one embodiment of the present invention. FIG. 16A is a circuit diagram of a pixel in an EL display device. FIG. 16B is a top view showing the whole of the EL display device. FIG. 16C is a cross-sectional view taken along part of dashed-dotted line M-N in FIG. 16B.

FIG. 16A illustrates an example of a circuit diagram of a pixel used in an EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Furthermore, in the case where a connection portion is disclosed in this specification and the like, it can be determined that one embodiment of the invention in which a connection portion is not specified is disclosed in this specification and the like, in some cases. Particularly in the case where the number of portions to which a terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Furthermore, it can be determined that one embodiment of the invention whose function is specified is disclosed in this specification and the like in some cases. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 16A includes a switching element 743, a transistor 741, a capacitor 742, and a light-emitting element 719.

Note that FIG. 16A and the like each illustrate an example of a circuit configuration; therefore, a transistor can be additionally provided. In contrast, for each node in FIG. 16A, it is also possible not to provide an additional transistor, switch, passive element, or the like.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. A power supply potential VDD is supplied to a drain of the transistor 741. The other terminal of the switching element 743 is electrically connected to a signal line 744. A constant potential is supplied to the other electrode of the light-emitting element 719. The constant potential is a ground potential GND or a potential lower than the ground potential GND.

It is preferable to use a transistor as the switch element 743. When the transistor is used as the switching element, the area of a pixel can be reduced, so that the EL display device can have high resolution. As the switching element 743, a transistor formed through the same step as the transistor 741 can be used, so that EL display devices can be manufactured with high productivity. Note that as the transistor 741 and/or the switching element 743, any of the above-described transistors can be used, for example.

FIG. 16B is a top view of an EL display device. The EL display device includes a substrate 700, a substrate 750, a sealant 734, a driver circuit 735, a driver circuit 736, a pixel 737, and an FPC 732. The sealant 734 is provided between the substrate 700 and the substrate 750 so as to surround the pixel 737, the driver circuit 735, and the driver circuit 736. Note that the driver circuit 735 and/or the driver circuit 736 may be provided outside the sealant 734.

FIG. 16C is a cross-sectional view of the EL display device taken along part of dashed-dotted line M-N in FIG. 16B.

FIG. 16C illustrates a structure of the transistor 741 including a conductor 704 over the substrate 700; an insulator 712a, in which the conductor 704 is embedded; an insulator 712b over the insulator 712a; a semiconductor 706a, a semiconductor 706b, and a semiconductor 706c, which are over the insulator 712b and overlap with the conductor 704; a conductor 716a and a conductor 716b in contact with the semiconductors 706a and 706b; an insulator 718a over the semiconductor 706c, the conductor 716a, and the conductor 716b; an insulator 718b over the insulator 718a; and a conductor 714a that is over the insulator 718a and overlaps with the semiconductor 706c. Note that the structure of the transistor 741 is just an example; the transistor 741 may have a structure different from that illustrated in FIG. 16C.

Thus, in the transistor 741 illustrated in FIG. 16C, the conductor 704 serves as a gate electrode, the insulator 712b serves as a gate insulator, the conductor 716a serves as a source electrode, the conductor 716b serves as a drain electrode, the insulator 718a serves as a gate insulator, and the conductor 714a serves as a gate electrode. Note that in some cases, electrical characteristics of the semiconductors 706a and 706b change if light enters the semiconductor. To prevent this, it is preferable that one or more of the conductor 704, the conductor 716a, the conductor 716b, and the conductor 714a have a light-blocking property.

Note that in the case where the insulator 718a and the insulator 718b are formed using insulators of the same kind, the insulator 718a and the insulator 718b are not distinguished from each other in some cases depending on an observation method.

In FIG. 16C, a conductor 714b over the insulator 718b, an insulator 718c over the conductor 714b, and a conductor 714c that is over the insulator 718c and overlaps with the conductor 714b are provided as a capacitor 742.

In the capacitor 742, the conductor 714b serves as one electrode, and the conductor 714c serves as the other electrode. Thus, the capacitor 742 can be formed using a film of a wiring of the transistor 741.

Note that the structure of capacitor of one embodiment of the present invention is not limited thereto. For example, the insulator 718c may completely cover the conductor 714b. In that case, a structure in which part of the insulator 718c is removed to reduce the thickness of the region where the conductor 714b and the conductor 714c overlap with each other may be used.

An insulator 720 is provided over the transistor 741 and the capacitor 742. Here, the insulator 720 may have an opening reaching the conductor 716a that serves as the source electrode of the transistor 741. A conductor 781 is provided over the insulator 720. The conductor 781 may be electrically connected to the transistor 741 through the opening in the insulator 720.

A partition wall 784 having an opening reaching the conductor 781 is provided over the conductor 781. A light-emitting layer 782 in contact with the conductor 781 through the opening provided in the partition wall 784 is provided over the partition wall 784. A conductor 783 is provided over the light-emitting layer 782. A region where the conductor 781, the light-emitting layer 782, and the conductor 783 overlap with one another serves as the light-emitting element 719.

So far, examples of the EL display device are described. Next, an example of a liquid crystal display device is described.

Figure 17A:
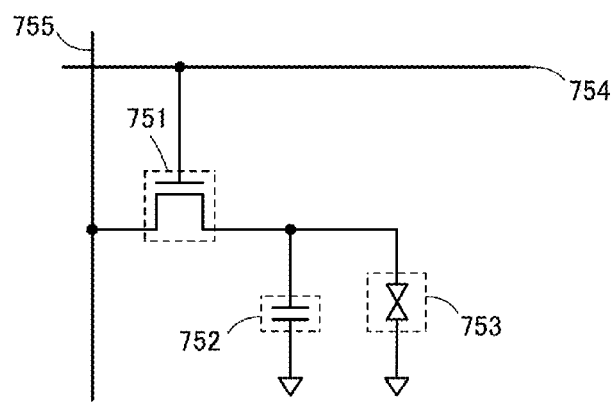
FIG. 17A is a circuit diagram and FIG. 17B is a cross-sectional view of a display device of one embodiment of the present invention.

FIG. 17A is a circuit diagram showing a structure example of a pixel of the liquid crystal display device. A pixel illustrated in FIGS. 17A and 17B includes a transistor 751, a capacitor 752, and an element (liquid crystal element) 753 in which a space between a pair of electrodes is filled with a liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring that supplies a common potential.

One electrode of the liquid crystal element 753 is electrically connected to the other of the source and the drain of the transistor 751, and the other electrode of the liquid crystal element 753 is electrically connected to a wiring that supplies a common potential. The common potential supplied to the wiring electrically connected to the other electrode of the capacitor 752 may be different from that supplied to the other electrode of the liquid crystal element 753.

Figure 17B:
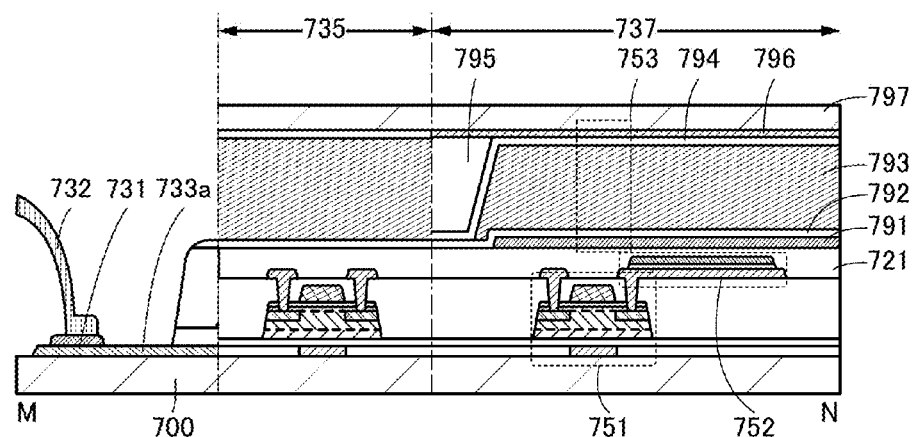

Note that the description of the liquid crystal display device is made on the assumption that the top view of the liquid crystal display device is similar to that of the EL display device. FIG. 17B is a cross-sectional view of the liquid crystal display device taken along part of dashed-dotted line M-N in FIG. 16B. In FIG. 17B, the FPC 732 is connected to the wiring 733a via the terminal 731. Note that the wiring 733a may be formed using the same kind of conductor as the conductor of the transistor 751 or using the same kind of semiconductor as the semiconductor of the transistor 751.

For the transistor 751, refer to the description of the transistor 741. For the capacitor 752, refer to the description of the capacitor 742. Note that the structure of the capacitor 752 in FIG. 17B corresponds to, but is not limited to, the structure of the capacitor 742 in FIG. 16C.

Note that in the case where an oxide semiconductor is used as the semiconductor of the transistor 751, the off-state current of the transistor 751 can be extremely small. Therefore, an electric charge held in the capacitor 752 is unlikely to leak, so that the voltage applied to the liquid crystal element 753 can be maintained for a long time. Accordingly, the transistor 751 can be kept off during a period in which moving images with few motions or a still image are/is displayed, whereby power for the operation of the transistor 751 can be saved in that period; accordingly a liquid crystal display device with low power consumption can be provided. Furthermore, the area occupied by the capacitor 752 can be reduced; thus, a liquid crystal display device with a high aperture ratio or a high-resolution liquid crystal display device can be provided.

An insulator 721 is provided over the transistor 751 and the capacitor 752. The insulator 721 has an opening reaching the transistor 751. A conductor 791 is provided over the insulator 721. The conductor 791 is electrically connected to the transistor 751 through the opening in the insulator 721.

An insulator 792 serving as an alignment film is provided over the conductor 791. A liquid crystal layer 793 is provided over the insulator 792. An insulator 794 serving as an alignment film is provided over the liquid crystal layer 793. A spacer 795 is provided over the insulator 794. A conductor 796 is provided over the spacer 795 and the insulator 794. A substrate 797 is provided over the conductor 796.

Owing to the above-described structure, a display device including a capacitor occupying a small area, a display device with high display quality, or a high-resolution display device can be provided.

For example, in this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of a light-emitting diode (LED) for white, red, green, blue, or the like, a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, a display element including a carbon nanotube, and the like. Other than the above, display media whose contrast, luminance, reflectivity, transmittance, or the like is changed by electrical or magnetic effect may be included.

Examples of display devices having EL elements include an EL display. Examples of a display device including an electron emitter include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device having electronic ink, or an electrophoretic element include electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor thereover, such as an n-type GaN semiconductor including crystals. Furthermore, a p-type GaN semiconductor including crystals or the like can be provided thereover, and thus the LED can be formed. Note that an AlN layer may be provided between the n-type GaN semiconductor including crystals and graphene or graphite. The GaN semiconductors included in the LED may be formed by MOCVD. Note that when the graphene is provided, the GaN semiconductors included in the LED can also be formed by a sputtering method.

(Embodiment 5)

In this embodiment, a structure example of a semiconductor device including the transistor of one embodiment of the present invention will be described with reference to drawings.

The semiconductor device of one embodiment of the present invention can be used for display devices, personal computers, image reproducing devices provided with recording media (typically, devices which reproduce the content of recording media such as digital versatile discs (DVD) and have displays for displaying the reproduced images), or the like. Other examples of electronic devices that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. Specific examples of these electronic devices are illustrated in FIGS. 18A to 18F.

Figure 18A:
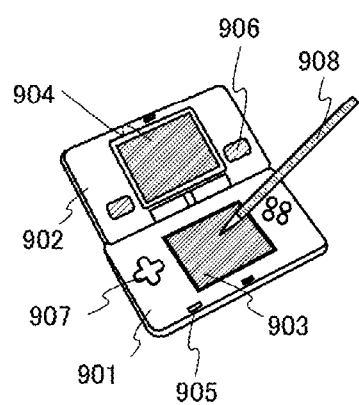
FIGS. 18A to 18F illustrate electronic devices of embodiments of the present invention.

FIG. 18A illustrates a portable game console including a housing 901, a housing 902, a display portion 903, a display portion 904, a microphone 905, a speaker 906, an operation key 907, a stylus 908, and the like. Although the portable game console in FIG. 18A has the two display portions 903 and 904, the number of display portions included in a portable game console is not limited to this.

Figure 18B:
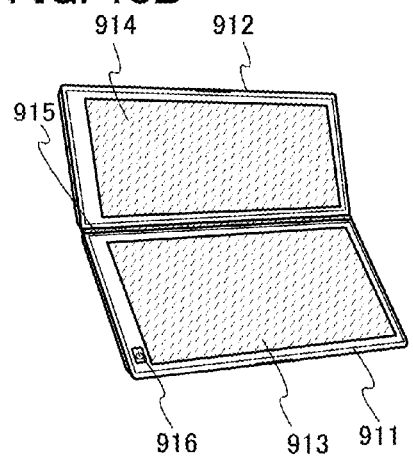

FIG. 18B illustrates a portable data terminal including a housing 911, a housing 912, a display portion 913, a display portion 914, a joint 915, an operation key 916, and the like. The display portion 913 is provided in the housing 911, and the display portion 914 is provided in the housing 912. The housing 911 and the housing 912 are connected to each other with the joint 915, and the angle between the housing 911 and the housing 912 can be changed with the joint 915. Images displayed on the display portion 913 may be switched in accordance with the angle at the joint 915 between the housing 911 and the housing 912. A display device with a position input function may be used as at least one of the display portion 913 and the display portion 914. Note that the position input function can be added by provision of a touch panel in a display device. Alternatively, the position input function can be added by provision of a photoelectric conversion element called a photosensor in a pixel portion of a display device.

Figure 18C:
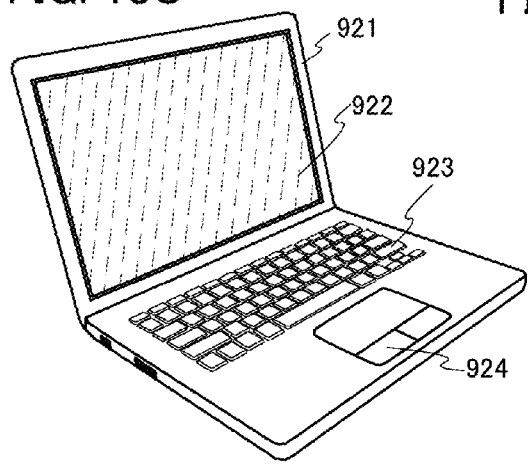

FIG. 18C illustrates a laptop personal computer, which includes a housing 921, a display portion 922, a keyboard 923, a pointing device 924, and the like.

Figure 18D:
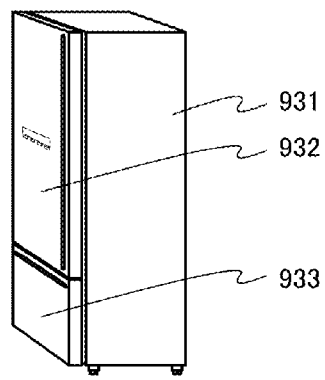

FIG. 18D illustrates an electric refrigerator-freezer including a housing 931, a door for a refrigerator 932, a door for a freezer 933, and the like.

Figure 18E:
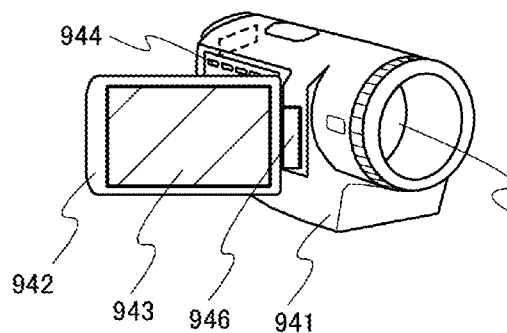

FIG. 18E illustrates a video camera including a housing 941, a housing 942, a display portion 943, operation keys 944, a lens 945, a joint 946, and the like. The operation keys 944 and the lens 945 are provided for the housing 941, and the display portion 943 is provided for the housing 942. The housing 941 and the housing 942 are connected to each other with the joint 946, and the angle between the housing 941 and the housing 942 can be changed with the joint 946. Images displayed on the display portion 943 may be switched in accordance with the angle at the joint 946 between the housing 941 and the housing 942.

Figure 18F:
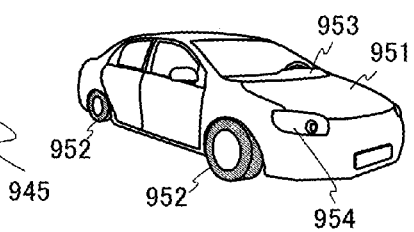

FIG. 18F illustrates a car including a car body 951, wheels 952, a dashboard 953, lights 954, and the like.

The structures, the methods, and the like described in this embodiment can be combined as appropriate with any of the structures, the methods, and the like described in the other embodiments.

This application is based on Japanese Patent Application serial No. 2015-032320 filed with Japan Patent Office on Feb. 20, 2015, the entire contents of which are hereby incorporated by reference.

What is claimed is:

1. A semiconductor device comprising:
   an oxide semiconductor body over a substrate;
   a first electrode and a second electrode in direct contact with the oxide semiconductor body;
   a first insulator over and in direct contact with the oxide semiconductor body, the first electrode, and the second electrode; and
   a third electrode over the first insulator,
   wherein the oxide semiconductor body includes a first region overlapped by the first electrode, a second region overlapped by the second electrode, and a third region overlapped by the third electrode,
   wherein a top surface of the first electrode and a top surface of the second electrode are provided on a same plane as a top surface of the oxide semiconductor body, and
   wherein the first electrode and the second electrode each contain at least an element selected from the group consisting of molybdenum, titanium, tantalum, tungsten, aluminum, copper, chromium, neodymium, and scandium.

2. The semiconductor device according to claim 1,
   wherein the oxide semiconductor body includes a region where a channel is to be formed, and
   wherein the first insulator does not have a difference in level in a region overlapping with the region where the channel is to be formed.

3. The semiconductor device according to claim 1,
   wherein the first electrode serves as one of a source electrode and a drain electrode, and wherein the second electrode serves as the other of the source electrode and the drain electrode.

4. An electronic device comprising the semiconductor device according to claim 1.

5. A semiconductor device comprising an oxide semiconductor body, a first electrode, a second electrode, a third electrode, and a first insulator,
   wherein each of the first electrode and the second electrode is in direct contact with the oxide semiconductor body,
   wherein the first insulator is over and in direct contact with the oxide semiconductor body,
   wherein the third electrode is provided over the oxide semiconductor body with the first insulator interposed therebetween,
   wherein the oxide semiconductor body includes a first region overlapped by the first electrode, a second region overlapped by the second electrode, and a third region overlapped by the third electrode,
   wherein a top surface of the first electrode and a top surface of the second electrode are provided on a same plane as a surface of the oxide semiconductor body closest to the first insulator, and
   wherein the first electrode and the second electrode each contain at least an element selected from the group consisting of molybdenum, titanium, tantalum, tungsten, aluminum, copper, chromium, neodymium, and scandium.

6. The semiconductor device according to claim 5,
   wherein the oxide semiconductor body includes a region where a channel is to be formed, and
   wherein the first insulator does not have a difference in level in a region overlapping with the region where the channel is to be formed.

7. The semiconductor device according to claim 5,
   wherein the first electrode serves as one of a source electrode and a drain electrode, and
   wherein the second electrode serves as the other of the source electrode and the drain electrode.

8. An electronic device comprising the semiconductor device according to claim 5.

9. The semiconductor device according to claim 1, further comprising:
   a second insulator under and in direct contact with the oxide semiconductor body.

10. The semiconductor device according to claim 5, further comprising:
    a second insulator under and in direct contact with the oxide semiconductor body.

* * * * *